(12) United States Patent
Momose et al.

(10) Patent No.: US 11,723,224 B2
(45) Date of Patent: Aug. 8, 2023

(54) IMAGING APPARATUS

(71) Applicant: Panasonic Intellectual Property Management Co., Ltd., Osaka (JP)

(72) Inventors: Tatsunori Momose, Osaka (JP); Hiroaki Iijima, Nara (JP); Masumi Izuchi, Osaka (JP); Seiji Takagi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 285 days.

(21) Appl. No.: 17/231,614

(22) Filed: Apr. 15, 2021

(65) Prior Publication Data
US 2021/0335889 A1    Oct. 28, 2021

(30) Foreign Application Priority Data
Apr. 27, 2020   (JP) .................................. 2020-078451

(51) Int. Cl.
*H10K 39/32* (2023.01)
*H10K 30/10* (2023.01)
*H10K 30/20* (2023.01)
*H10K 30/30* (2023.01)
*H10K 85/20* (2023.01)
*H10K 85/30* (2023.01)
*H10K 85/60* (2023.01)

(52) U.S. Cl.
CPC ............. *H10K 39/32* (2023.02); *H10K 30/10* (2023.02); *H10K 30/211* (2023.02); *H10K 30/353* (2023.02); *H10K 85/211* (2023.02); *H10K 85/311* (2023.02); *H10K 85/6572* (2023.02)

(58) Field of Classification Search
None
See application file for complete search history.

(56) References Cited

FOREIGN PATENT DOCUMENTS

JP       2009049278    *  8/2007
JP       2014-022525      2/2014

OTHER PUBLICATIONS

P. C. Eklund et al., "Photochemical transformation of C60 and C70 films", Thin Solid Films 257, Mar. 1, 1995, pp. 185-203.

* cited by examiner

*Primary Examiner* — Evren Seven
(74) *Attorney, Agent, or Firm* — McDermott Will & Emery LLP

(57) ABSTRACT

An imaging apparatus includes a first electrode, a second electrode, and a photoelectric conversion layer located between the first electrode and the second electrode. The photoelectric conversion layer contains a first material, a second material, and a third material. The first material is a fullerene or a fullerene derivative. The second material is a donor-like organic semiconductor material. The average absorption coefficient in the visible light wavelength range of the third material is less than the average absorption coefficient in the visible light wavelength range of the first material.

16 Claims, 10 Drawing Sheets

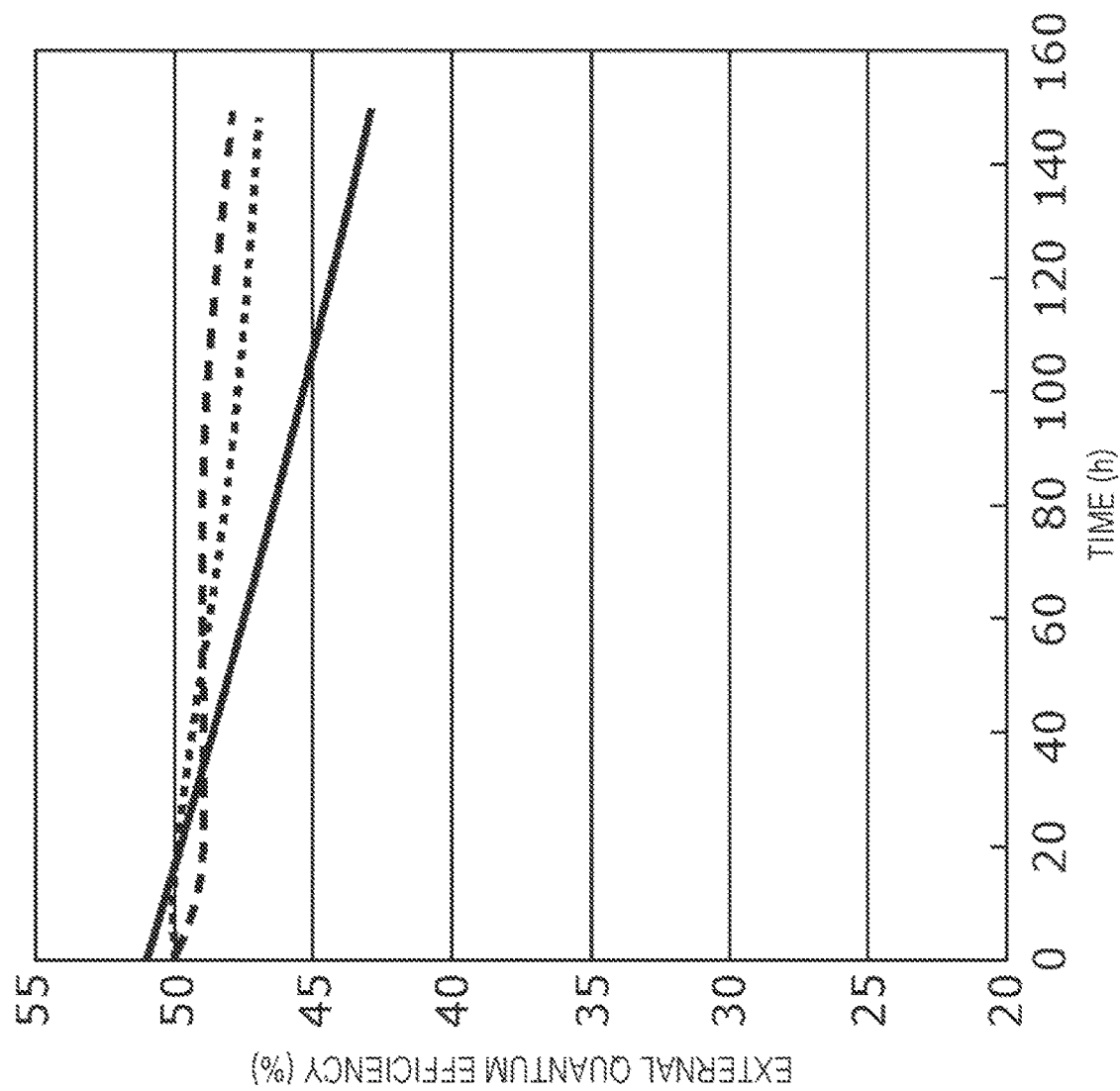

IMAGING APPARATUS

BACKGROUND

1. Technical Field

The present disclosure relates to an imaging apparatus.

2. Description of the Related Art

Organic semiconductor materials have physical properties, functions, and the like which are not available in inorganic semiconductor materials in the related art. Therefore, in recent years, intensive research has been performed on organic semiconductor materials serving as semiconductor materials that can be used to realize new semiconductor devices and electronic equipment.

For example, research has been performed regarding realization of a photoelectric conversion element through forming an organic semiconductor material into a thin film so as to use as a photoelectric conversion material. For example, as disclosed in Japanese Patent No. 5969843, a photoelectric conversion element including an organic material thin film can be exploited as an optical sensor such as a solid-state imaging element by causing an electric charge generated by light to be output as an electric signal.

Meanwhile, as disclosed in P. C. Eklund et al., "Photochemical transformation of C60 and C70 films", Thin Solid Films, Elsevier B. V., 1995, Vol. 257, pp. 185-203, it is known that fullerenes and fullerene derivatives, which are widely used as acceptor materials for photoelectric conversion elements using organic semiconductor materials, cause a polymerization reaction in which bonding occurs due to energy of light or the like.

SUMMARY

In one general aspect, the techniques disclosed here feature an imaging apparatus including a first electrode, a second electrode, and a photoelectric conversion layer located between the first electrode and the second electrode. The photoelectric conversion layer contains a first material, a second material, and a third material. The first material is a fullerene or a fullerene derivative. The second material is a donor-like organic semiconductor material. The average absorption coefficient in the visible light wavelength range of the third material is less than the average absorption coefficient in the visible light wavelength range of the first material.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 10 is a diagram illustrating change over time of the external quantum efficiency of a photoelectric conversion element in Examples 1 to 5 and Comparative example 1.

DETAILED DESCRIPTION

Figure 1:
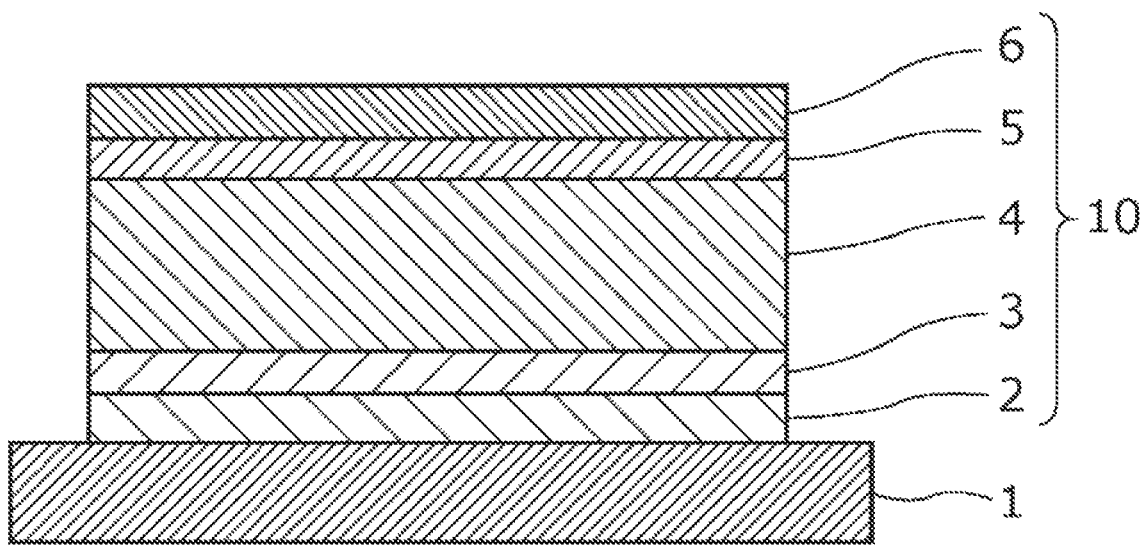
FIG. 1 is a schematic sectional view illustrating a photoelectric conversion element according to an embodiment.

Underlying Knowledge Forming Basis of the Present Disclosure

The energy level of an organic semiconductor material can be changed by changing the molecular structure of an organic compound to be used. Therefore, for example, in the case in which an organic semiconductor material is used as a photoelectric conversion material, the absorption wavelength can be controlled. For example, spectral sensitivity can be provided even in the near-infrared light region in which silicon (Si), which is an inorganic semiconductor material, does not have spectral sensitivity. That is, the organic semiconductor material being used enables the light in a wavelength range which has not been used for photoelectric conversion to be exploited and enables the efficiency of a solar cell to be increased, thereby enabling an optical sensor and the like in the near-infrared light region to be realized. Consequently, in recent years, intensive research has been performed on photoelectric conversion elements and imaging apparatuses that use organic semiconductor materials. Hereafter, the photoelectric conversion element using the organic semiconductor material is also referred to as an "organic photoelectric conversion element".

However, the organic semiconductor material has poor durability with respect to light or heat compared with Si, which is an inorganic material, and tends to cause a reaction or decomposition due to some type of energy. It is also known that fullerenes and fullerene derivatives, which are widely studied as an acceptor material of an organic photoelectric conversion element, cause polymerization due to light. The molecular orbital energy level of a fullerene or a fullerene derivative changes due to polymerization. Therefore, even if a fullerene or a fullerene derivative is used for the photoelectric conversion element, the moving state of an electric charge is changed so as to change the characteristics of the photoelectric conversion element. As a result, the characteristics of the imaging apparatus including the photoelectric conversion element using a fullerene or a fullerene derivative are changed from the initial state.

Consequently, to improve the reliability of the organic photoelectric conversion element included in the imaging apparatus by suppressing a change in the characteristics of the organic photoelectric conversion element caused by light or heat, it is necessary to suppress polymerization of the fullerene or the fullerene derivative from occurring.

On this basis, the present inventors found that, regarding the imaging apparatus including the photoelectric conversion element in which a fullerene or a fullerene derivative is used as a photoelectric conversion layer, a change in the characteristics of the photoelectric conversion element can be suppressed and the reliability of the photoelectric conversion element can be improved by suppressing polymerization of the fullerene or the fullerene derivative from occurring.

Accordingly, the present disclosure provides an imaging apparatus including a photoelectric conversion element in which a fullerene or a fullerene derivative is used as a photoelectric conversion layer and which has improved reliability due to a reduction of a change in the characteristics.

An outline of an aspect of the present disclosure is as described below.

An imaging apparatus according to an aspect of the present disclosure includes a first electrode, a second electrode, and a photoelectric conversion layer located between the first electrode and the second electrode. The photoelectric conversion layer contains a first material, a second material, and a third material. The first material is a fullerene or a fullerene derivative. The second material is a donor-like organic semiconductor material. The average absorption coefficient in the visible light wavelength range of the third material is less than the average absorption coefficient in the visible light wavelength range of the first material.

As described above, the photoelectric conversion layer containing the third material enables molecules of the first material that is a fullerene or a fullerene derivative to be suppressed from approaching each other by using the third material so that polymerization does not readily occur. As a result, since a change in the characteristics of the photoelectric conversion element is suppressed, the reliability of the photoelectric conversion element can be improved. Consequently, an imaging apparatus including the photoelectric conversion element having improved reliability is realized. In addition, since the absorption coefficient in the visible light wavelength range of the third material is less than the absorption coefficient in the visible light wavelength range of the first material, generation of an electron-hole pair due to absorption of light by the second material that is a donor-like organic semiconductor material is not readily hindered by the third material, and the photoelectric conversion efficiency of the photoelectric conversion element is suppressed from being reduced.

For example, the average absorption coefficient in the visible light wavelength range of the third material may be less than the average absorption coefficient in the visible light wavelength range of the second material.

Accordingly, it becomes more difficult for the third material to hinder generation of an electron-hole pair due to absorption of light by the second material, and the photoelectric conversion efficiency of the photoelectric conversion element is further suppressed from being reduced.

For example, the average absorption coefficient in the visible light wavelength range of the third material may be less than or equal to 4 $\mu m^{-1}$.

Accordingly, it becomes difficult for the third material to hinder generation of an electron-hole pair due to absorption of light by the second material, and the photoelectric conversion efficiency of the photoelectric conversion element is further suppressed from being reduced.

For example, the ionization potential of the third material may be greater than the ionization potential of the second material.

Accordingly, a hole generated in the second material is suppressed from moving to the third material, and transportation of an electric charge in the photoelectric conversion layer is smoothly performed.

For example, the electron affinity of the third material may be less than the electron affinity of the first material.

Accordingly, an electron accepted by the first material is suppressed from moving to the third material, and transportation of an electric charge in the photoelectric conversion layer is smoothly performed.

For example, the content of the third material in the photoelectric conversion layer may be greater than or equal to 0.1% by weight and less than or equal to 10% by weight.

Accordingly, polymerization of a fullerene or a fullerene derivative that is the first material can be effectively suppressed from occurring, and a change in the characteristics of the photoelectric conversion element can be further suppressed.

For example, the band gap of the third material may be greater than or equal to 3.0 eV.

Accordingly, since the third material becomes transparent in response to the visible light, absorption of the visible light by the second material is not hindered, and generation of an electron-hole pair due to absorption of light by the second material is not readily hindered.

For example, the third material may be an organic semiconductor material.

Accordingly, the third material that is an organic semiconductor material can be responsible for transporting an electric charge generated by the photoelectric conversion layer absorbing the light. Therefore, regarding the imaging apparatus, a dark current resulting from a generated electric charge remaining in the photoelectric conversion layer is suppressed from occurring.

For example, the imaging apparatus may further include an electric charge blocking layer located between the first electrode and the photoelectric conversion layer.

Accordingly, the electric charge blocking layer can suppress charge injection from the first electrode and can suppress a dark current from occurring.

For example, the electric charge blocking layer may contain the third material.

The electric charge blocking layer containing the third material that is contained in the photoelectric conversion layer, as described above, enables the production method to be simplified.

For example, the content of the second material in the photoelectric conversion layer may be greater than or equal to 10% by weight and less than or equal to 25% by weight.

Accordingly, a high photoelectric conversion efficiency is readily realized.

For example, the imaging apparatus may further include a visible light absorbing layer located between the photoelectric conversion layer and the second electrode.

Accordingly, a fullerene or a fullerene derivative that is the first material contained in the photoelectric conversion layer being suppressed from absorbing the visible light enables polymerization of the fullerene or the fullerene derivative to be suppressed from occurring.

For example, the average absorption coefficient in the visible light wavelength range of the visible light absorbing layer may be greater than or equal to 2 $\mu m^{-1}$ and less than or equal to 16 $\mu m^{-1}$.

Accordingly, since the visible light absorbing layer appropriately absorbs the visible light, the photoelectric conversion efficiency of the photoelectric conversion element can be suppressed from being reduced while polymerization of the fullerene or the fullerene derivative that is the first material contained in the photoelectric conversion layer is suppressed from occurring.

For example, the visible light absorbing layer may contain the second material.

The visible light absorbing layer containing the second material that is contained in the photoelectric conversion layer, as described above, enables the production method to be simplified.

For example, the visible light absorbing layer may contain the third material.

Accordingly, the visible light absorbing layer containing the third material that is contained in the photoelectric conversion layer enables the production method to be simplified.

For example, the photoelectric conversion layer may be a mixture film having a bulk heterostructure that contains the first material, the second material, and the third material.

Accordingly, since the contact area of each material contained in the photoelectric conversion layer increases, transfer of an electric charge between the materials in the photoelectric conversion layer is smoothed.

An embodiment according to the present disclosure will be specifically described below with reference to the drawings.

In this regard, the embodiment explained below describes general or specific examples. The numerical values, shapes, constituents, arrangement positions and connection forms of constituents, steps, order of the steps, and the like described in the following embodiment are examples and are not intended to limit the present disclosure. Of the constituents in the following embodiment, the constituents that are not described in the independent claim illustrating the most significant concept are explained as optional constituents. The drawings are not limited to being precisely illustrated. In the drawings, substantially the same configurations may be denoted by the same references, and duplicate explanations may be omitted or simplified.

Embodiment

Photoelectric Conversion Element

A photoelectric conversion element included in an imaging apparatus according to the present embodiment will be described with reference to FIG. 1. The photoelectric conversion element according to the present embodiment is a photoelectric conversion element of a charge-reading system. FIG. 1 is a schematic sectional view illustrating a photoelectric conversion element 10 according to the present embodiment.

As illustrated in FIG. 1, the photoelectric conversion element 10 is supported by a support substrate 1 and includes a first electrode 2 and a second electrode 6 which are a pair of electrodes, a photoelectric conversion layer 4 located between the first electrode 2 and the second electrode 6, a visible light absorbing layer 5 located between the second electrode 6 and the photoelectric conversion layer 4, and an electron blocking layer 3 located between the first electrode 2 and the photoelectric conversion layer 4. The electron blocking layer 3 is an example of the electric charge blocking layer. In this regard, the photoelectric conversion element 10 may have a structure in which neither the electron blocking layer 3 nor the visible light absorbing layer 5 is included and in which the first electrode 2, the second electrode 6, and the photoelectric conversion layer 4 are stacked.

Each constituent of the photoelectric conversion element 10 according to the present embodiment will be described below.

The support substrate 1 is a substrate used for supporting a common photoelectric conversion element and may be, for example, a glass substrate, a quartz substrate, a semiconductor substrate, or a plastic substrate.

The first electrode 2 is formed of a metal, a metal nitride, a metal oxide, a polysilicon provided with electrical conductivity, or the like. Examples of the metal include aluminum, copper, titanium, and tungsten. Examples of the method for providing the polysilicon with the electrical conductivity include doping with an impurity.

The second electrode 6 is a transparent electrode formed of, for example, a transparent conductive material. Examples of the material for forming the second electrode 6 include transparent conducting oxides (TCO), indium tin oxide (ITO), indium zinc oxide (IZO), aluminum-doped zinc oxide (AZO). fluorine-doped tin oxide (FTO), $SnO_2$, and $TiO_2$. The second electrode 6 may be produced by appropriately using TCO and metal materials such as aluminum (Al) and gold (Au) alone or in a combination of a plurality of types in accordance with predetermined transmittance.

The materials for forming the first electrode 2 and the second electrode 6 are not limited to the above-described conductive materials, and other materials may be used. For example, the first electrode 2 may be a transparent electrode.

Various methods are used for producing the first electrode 2 and the second electrode 6 in accordance with the materials used. For example, in the case in which ITO is used, an electron beam method, a sputtering method, a resistance-heating vapor deposition method, chemical reaction methods such as a sol-gel method, a method that applies indium-tin-oxide-dispersed material, and the like may be used. In this case, regarding production of the first electrode 2 and the second electrode 6, UV-ozone treatment, plasma treatment, or the like may be further performed after an ITO film is made.

The photoelectric conversion layer 4 contains the first material, the second material, and the third material. For producing the photoelectric conversion layer 4, for example, a wet method such as a coating method involving spin coating or the like or a dry method such as a vacuum vapor deposition method can be used. The vapor deposition method is a method in which a material of the layer is evaporated by heating in a vacuum and is deposited on the substrate. The photoelectric conversion layer 4 may be a mixture film having a bulk heterostructure that contains the first material, the second material, and the third material. Since the photoelectric conversion layer 4 being the mixture film having a bulk heterostructure increases the contact area of each material, transfer of an electric charge between the materials in the photoelectric conversion layer 4 is smoothed. The mixture film having a bulk heterostructure is formed by, for example, forming a film of the first material, the second material, and the third material by co-vapor deposition. Film formation by co-vapor deposition enables the photoelectric conversion layer 4 in which molecules are uniformly dispersed at the molecular level to be obtained. In this regard, the photoelectric conversion layer 4 may have a two-layer structure in which the first material and the second material are formed into different layers. In this case, the third material is contained in at least a layer containing the first material.

Examples of the first material, the second material, and the third material will be specifically described below.

The first material is an acceptor-like organic semiconductor material and is specifically a fullerene or a fullerene derivative. Examples of the fullerene include C60 fullerene and C70 fullerene. Examples of the fullerene derivative include phenyl-$C_{61}$-butyric acid methyl ester (PCBM) and indene-CW bisadduct (ICBA). The photoelectric conversion layer 4 may contain an acceptor-like organic semiconductor material other than the first material. Examples of the acceptor-like organic semiconductor material other than the first material include condensed aromatic carbon ring compounds (for example, naphthalene derivatives, anthracene derivatives, phenanthrene derivatives, tetracene derivatives, pyrene derivatives, perylene derivatives, and fluoranthene derivatives), 5- to 7-membered heterocyclic compounds containing a nitrogen atom, an oxygen atom, or a sulfur atom (for example, pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyrrolidine, pyrrolopyridine, thiadiazolopyridine, dibenzazepine, and tribenzazepine), polyarylene compounds, fluorene compounds, cyclopentadiene compounds, silyl compounds, and metal complexes including a nitrogen-containing heterocyclic compound as a ligand.

The second material is a donor-like organic semiconductor material. The second material absorbs light so as to generate an electron-hole pair. The second material provides the first material with a generated electron. Examples of the donor-like organic semiconductor material include triarylamine compounds, benzidine compounds, pyrazoline compounds, styrylamine compounds, hydrazone compounds, triphenylmethane compounds, carbazole compounds, polysilane compounds, thiophene compounds, phthalocyanine compounds, naphthalocyanine compounds, subphthalocyanine compounds, cyanine compounds, merocyanine compounds, oxonol compounds, polyamine compounds, indole compounds, pyrrole compounds, pyrazole compounds, polyarylene compounds, condensed aromatic carbon ring compounds (for example, naphthalene derivatives, anthracene derivatives, phenanthrene derivatives, tetracene derivatives, pyrene derivatives, perylene derivatives, and fluoranthene derivatives), and metal complexes including a nitrogen-containing heterocyclic compound as a ligand.

The second material is not limited to the above-described examples. Low-molecular-weight organic compounds and high-molecular-weight organic compounds may be used as the second material constituting the photoelectric conversion layer 4 provided that the organic compound is a donor-like organic semiconductor material which can be formed into a film serving as the photoelectric conversion layer 4 by either a dry or a wet method.

The second material may be another material. The second material may be, for example, a silicon semiconductor, a compound semiconductor, a quantum dot, a perovskite material, or a carbon nanotube or a mixture of these.

The content of the second material in the photoelectric conversion layer 4 is, for example, greater than or equal to 10% by weight and less than or equal to 25% by weight. The content of the second material being greater than or equal to 10% by weight and less than or equal to 25% by weight allows a high photoelectric conversion efficiency to be readily realized.

The third material is a material having an absorption coefficient in the visible light wavelength range of the third material less than the absorption coefficient in the visible light wavelength range of the first material. The photoelectric conversion layer 4 containing the third material enables molecules of the fullerene or the fullerene derivative that is the first material to be suppressed from coming into contact with each other and enables polymerization of the fullerene or the fullerene derivative to be suppressed from occurring. In addition, since the absorption coefficient in the visible light wavelength range of the third material is less than the absorption coefficient in the visible light wavelength range of the first material, generation of an electron-hole pair due to absorption of light by the second material is not readily hindered, and the photoelectric conversion efficiency of the photoelectric conversion element 10 is suppressed from being reduced. In the present specification, the average absorption coefficient in the visible light wavelength range is an average absorption coefficient in the wavelength range of greater than or equal to 400 nm and less than or equal to 700 nm. The absorption coefficient is a numerical value obtained by, for example, dividing the absorbance measured with a spectrophotometer by the film thickness.

The absorption coefficient in the visible light wavelength range of the third material may be less than the absorption coefficient in the visible light wavelength range of the second material. Accordingly, it becomes more difficult to hinder generation of an electron-hole pair due to absorption of light by the second material, and the photoelectric conversion efficiency of the photoelectric conversion element 10 is further suppressed from being reduced.

The average absorption coefficient in the visible light wavelength range of the third material may be less than or equal to, for example, 4 $\mu m^{-1}$. Accordingly, it becomes difficult to hinder generation of an electron-hole pair due to absorption of light by the second material, and the photoelectric conversion efficiency of the photoelectric conversion element 10 is further suppressed from being reduced. The average absorption coefficient in the visible light wavelength range of the third material may be less than or equal to 3 $\mu m^{-1}$.

The third material is, for example, a material that can be mixed by the same method when the photoelectric conversion layer 4 is produced by using the first material and the second material. Regarding the third material, for example, low-molecular-weight organic compounds, high-molecular-weight organic compounds, and inorganic materials such as glass, ceramics, and metal compounds can be used alone or in combination in accordance with the method for producing the photoelectric conversion layer 4.

The third material may be a semiconductor material such as an organic semiconductor material that can perform electric charge transportation in the photoelectric conversion layer 4. Consequently, since the third material that is a semiconductor material such as an organic semiconductor material does not hinder electric charge transportation in the photoelectric conversion layer 4, the photoelectric conversion efficiency of the photoelectric conversion element 10 is suppressed from being reduced.

In the case in which an organic semiconductor material is used as the third material, examples of the organic semiconductor material include 9,9'-[1,1'-biphenyl]-4,4'-diylbis [3,6-bis(1,1-dimethyl ethyl)]-9H-carbazole, N,N'-di(1-naphthyl)-N,N'-diphenyl-(1,1'-biphenyl)-4,4'-diamine (NPD), 2,2'-dimethyl-N,N'-di-[(1-naphthyl)-N,N'-diphenyl]-1,1'-biphenyl-4,4'-diamine (α-NPD), 9,9-dimethyl-N, N'-di(1-naphthyl)-N,N'-diphenyl-9H-fluorene-2,7-diamine (DMFL-NPB), poly-TPD, 4,4',4''-tris[phenyl(m-tolyl) amino]triphenylamine (m-MTDATA), and tris[4-(5-dicyanomethylidenemethyl-2-thienyl)phenyl]amine (TDCV-TPA). Regarding the organic semiconductor material, materials other than these described above may be used.

In the case in which the third material is a semiconductor material, the band gap of the third material may be greater than or equal to 3.0 eV. Consequently, since the third material becomes transparent in response to the visible light, absorption of the visible light by the second material is not hindered, and it becomes difficult to hinder generation of an electron-hole pair by the second material.

The content of the third material in the photoelectric conversion layer 4 may be, for example, greater than or equal to 0.1% by weight and less than or equal to 10% by weight. The content of the third material being greater than or equal to 0.1% by weight and less than or equal to 10% by weight enables polymerization of the fullerene or the fullerene derivative that is the first material to be effectively suppressed from occurring. Consequently, a change in the characteristics of the photoelectric conversion element 10 is further suppressed, and, thereby the reliability of the imaging apparatus 100 can be further improved. From the viewpoint of reducing the influence of the photoelectric conversion element 10 on the photoelectric conversion efficiency, the content of the third material may be greater than or equal to 1% by weight and less than or equal to 5% by weight. From the viewpoint of suppressing a change in the characteristics of the photoelectric conversion element 10 for a longer duration, the content of the third material may be greater than or equal to 1% by weight and less than or equal to 3% by weight.

The photoelectric conversion element 10 according to the present embodiment includes the electron blocking layer 3 located between the first electrode 2 and the photoelectric conversion layer 4 and the visible light absorbing layer 5 located between the second electrode 6 and the photoelectric conversion layer 4.

The electron blocking layer 3 has a function of transporting a hole from the photoelectric conversion layer 4 to the first electrode 2 and, in addition, blocks movement of an electron from the first electrode 2 to the photoelectric conversion layer 4. The photoelectric conversion element 10 including the electron blocking layer 3 enables injection of an electric charge from the first electrode 2 to be suppressed and enables miscellaneous signals that are caused by a dark current flowing due to injection of an electric charge and that adversely affect the signal-to-noise (SN) ratio to be reduced.

The visible light absorbing layer 5 absorbs part of the visible light incident on the photoelectric conversion layer 4. Consequently, the fullerene or the fullerene derivative that is the first material contained in the photoelectric conversion layer 4 is suppressed from absorbing the visible light and, therefore, polymerization of the fullerene or the fullerene derivative can be suppressed from occurring.

The average absorption coefficient in the visible light wavelength range of the visible light absorbing layer 5 is, for example, greater than or equal to 2 $\mu m^{-1}$ and less than or equal to 16 $\mu m^{-1}$. Consequently, since the visible light absorbing layer 5 appropriately absorbs the visible light, the photoelectric conversion efficiency of the photoelectric conversion element 10 can be suppressed from being reduced while polymerization of the fullerene or the fullerene derivative contained in the photoelectric conversion layer 4 is suppressed from occurring. The average absorption coefficient in the visible light wavelength range of the visible light absorbing layer 5 may be greater than or equal to 2 $\mu m^{-1}$ and less than or equal to 10 $\mu m^{-1}$ or may be greater than or equal to 4 $\mu m^{-1}$ and less than or equal to 8 $\mu m^{-1}$.

The visible light absorbing layer 5 may function as a hole blocking layer for blocking movement of a hole from the second electrode 6 to the photoelectric conversion layer 4. The visible light absorbing layer 5 also functioning as a hole blocking layer enables injection of an electric charge from the second electrode 6 to be suppressed and enables miscellaneous signals that adversely affect the signal-to-noise (SN) ratio to be reduced.

Regarding the semiconductor materials used for the electron blocking layer 3 and the visible light absorbing layer 5, for example, a semiconductor material having an energy band described later is used. The electron blocking layer 3 and the visible light absorbing layer 5 are formed of, for example, the organic semiconductor materials described above as examples. The materials for forming the electron blocking layer 3 and the visible light absorbing layer 5 are not limited to the organic semiconductor materials and may be semiconductor materials other than the organic semiconductor materials. For example, the materials for forming the electron blocking layer 3 and the visible light absorbing layer 5 may be oxide semiconductors, nitride semiconductors, or the like and may be composite materials thereof.

The electron blocking layer 3 may contain, as a main material, the third material contained in the photoelectric conversion layer 4. The electron blocking layer 3 is composed of, for example, the third material contained in the photoelectric conversion layer 4. The electron blocking layer 3 containing the third material contained in the photoelectric conversion layer 4 enables the production method to be simplified. In the case in which the photoelectric conversion layer 4 is in contact with the electron blocking layer 3, as illustrated in the drawing, the electron blocking layer 3 containing the same third material as in the photoelectric conversion layer 4 improves the adhesiveness at the interface between the photoelectric conversion layer 4 and the electron blocking layer 3. In the case in which the third material is a semiconductor material, the electron blocking layer 3 containing the third material having the same orbital energy level as in the photoelectric conversion layer 4 smooths electric charge transportation in the electron blocking layer 3 and the photoelectric conversion layer 4.

There is no particular limitation regarding the material for forming the visible light absorbing layer 5 provided that the material absorbs the visible light. The visible light absorbing layer 5 may contain, as a main material, the second material contained in the photoelectric conversion layer 4. The visible light absorbing layer 5 is composed of, for example, the second material contained in the photoelectric conversion layer 4. Since the visible light absorbing layer 5 contains the second material contained in the photoelectric conversion layer 4, the visible light absorbing layer 5 functions as a hole blocking layer, and the production method can be simplified. In the case in which the visible light absorbing layer 5 contains the second material, the average absorption coefficient in the visible light wavelength range of the second material is, for example, greater than or equal to 2 $\mu m^{-1}$ and less than or equal to 16 $\mu m^{-1}$. In the case in which the photoelectric conversion layer 4 is in contact with the visible light absorbing layer 5, as illustrated in the drawing, the visible light absorbing layer 5 containing the same second material as in the photoelectric conversion layer 4 improves the adhesiveness at the interface between the photoelectric conversion layer 4 and the visible light absorbing layer 5.

The visible light absorbing layer 5 may contain, as a main material, the third material contained in the photoelectric conversion layer 4. The visible light absorbing layer 5 is composed of, for example, the third material contained in the photoelectric conversion layer 4. The visible light absorbing layer 5 containing the third material contained in the photoelectric conversion layer 4 enables the production method to be simplified. In the case in which the third material is a semiconductor material, the visible light absorbing layer 5 containing the third material having the same orbital energy level as in the photoelectric conversion layer 4 smooths electric charge transportation in the visible light absorbing layer 5 and the photoelectric conversion layer 4. In addition, the absorbance of the visible light absorbing layer 5 can be adjusted by appropriately selecting the third material.

Figure 2:
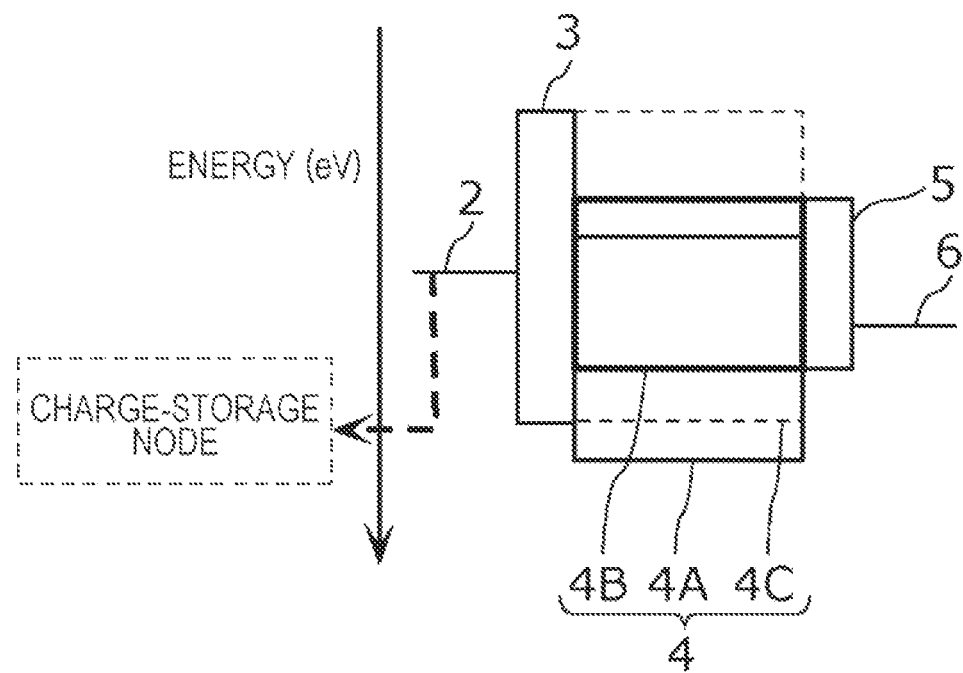
FIG. 2 is an exemplary energy band diagram of a photoelectric conversion element according to an embodiment.

FIG. 2 is an exemplary energy band diagram of the photoelectric conversion element 10 illustrated in FIG. 1. In FIG. 2, the energy band of each layer is indicated by a rectangle. FIG. 2 illustrates the case in which the third material is a semiconductor material.

The photoelectric conversion layer 4 generates an electron-hole pair inside in response to being irradiated with the light. The generated electron-hole pair is separated into an electron and a hole by an electric field applied to the photoelectric conversion layer 4. Each of the electron and the hole moves toward the first electrode 2 or the second electrode 6 in accordance with the electric field. Herein, a material that provides another material with the electron of the electron-hole pair generated by absorption of the light is referred to as a donor material, and a material that receives the electron is referred to as an acceptor material. The donor-like organic semiconductor material is a donor material and the acceptor-like organic material is an acceptor material. When the photoelectric conversion layer 4 is irradiated with the light, for example, the donor material generates an electron-hole pair and provides the acceptor material with the electron. In the case in which two different types of organic semiconductor materials are used, the type that serves as a donor material and the type that serves as an acceptor material are generally determined in accordance with the relative position of the energy levels of the highest-occupied-molecular-orbital (HOMO) and the lowest-unoccupied-molecular-orbital (LUMO) of each of the two types of organic semiconductor materials at the contact interface. As illustrated in FIG. 2, of the two types of organic semiconductor materials, the material having lower electron affinity, which is the energy difference between the vacuum level and the energy level of the LUMO, serves as the second material 4B that is a donor material, and the material having higher electron affinity serves as the first material 4A that is an acceptor material. Since the electron and the hole generated in the photoelectric conversion layer 4 are separated to the first material 4A and the second material 4B by the photoelectric conversion layer 4 containing the second material 4B that is a donor material and the first material 4A that is an acceptor material, as described above, the electron does not readily recombine with the hole. Therefore, the photoelectric conversion efficiency of the photoelectric conversion element 10 can be enhanced. In FIG. 2, regarding the rectangles indicating energy bands, the upper end denotes the energy level of the LUMO, and the lower end denotes the energy level of the HOMO.

As illustrated in FIG. 2, in the photoelectric conversion element 10 according to the present embodiment, for example, the ionization potential, which is the energy difference between the vacuum level and the energy level of the HOMO of the electron blocking layer 3, is greater than the ionization potential of the second material 4B of the photoelectric conversion layer 4.

As illustrated in FIG. 2, the ionization potential of the third material 4C is greater than the ionization potential of the second material 4B. Consequently, a hole generated in the second material 4B is suppressed from moving to the third material 4C, and electric charge transportation in the photoelectric conversion layer 4 is smoothed.

The electron affinity of the third material 4C is less than the electron affinity of the first material 4A. Consequently, the electron received by the first material 4A is suppressed from moving to the third material 4C, and electric charge transportation in the photoelectric conversion layer 4 is smoothed.

The electron affinity of the electron blocking layer 3 is less than the electron affinity of the first material 4A and the second material 4B. Consequently, an effect of the electron blocking layer 3 blocking movement of the electron is enhanced.

In the case in which the electron blocking layer 3 is composed of the third material 4C, as illustrated in FIG. 2, the electron affinity and the ionization potential of the electron blocking layer 3 are equal to the electron affinity and the ionization potential of the third material 4C.

As illustrated in FIG. 2, the first electrode 2 is electrically connected to a charge-storage node 34 described later.

Imaging Apparatus

Figure 3:
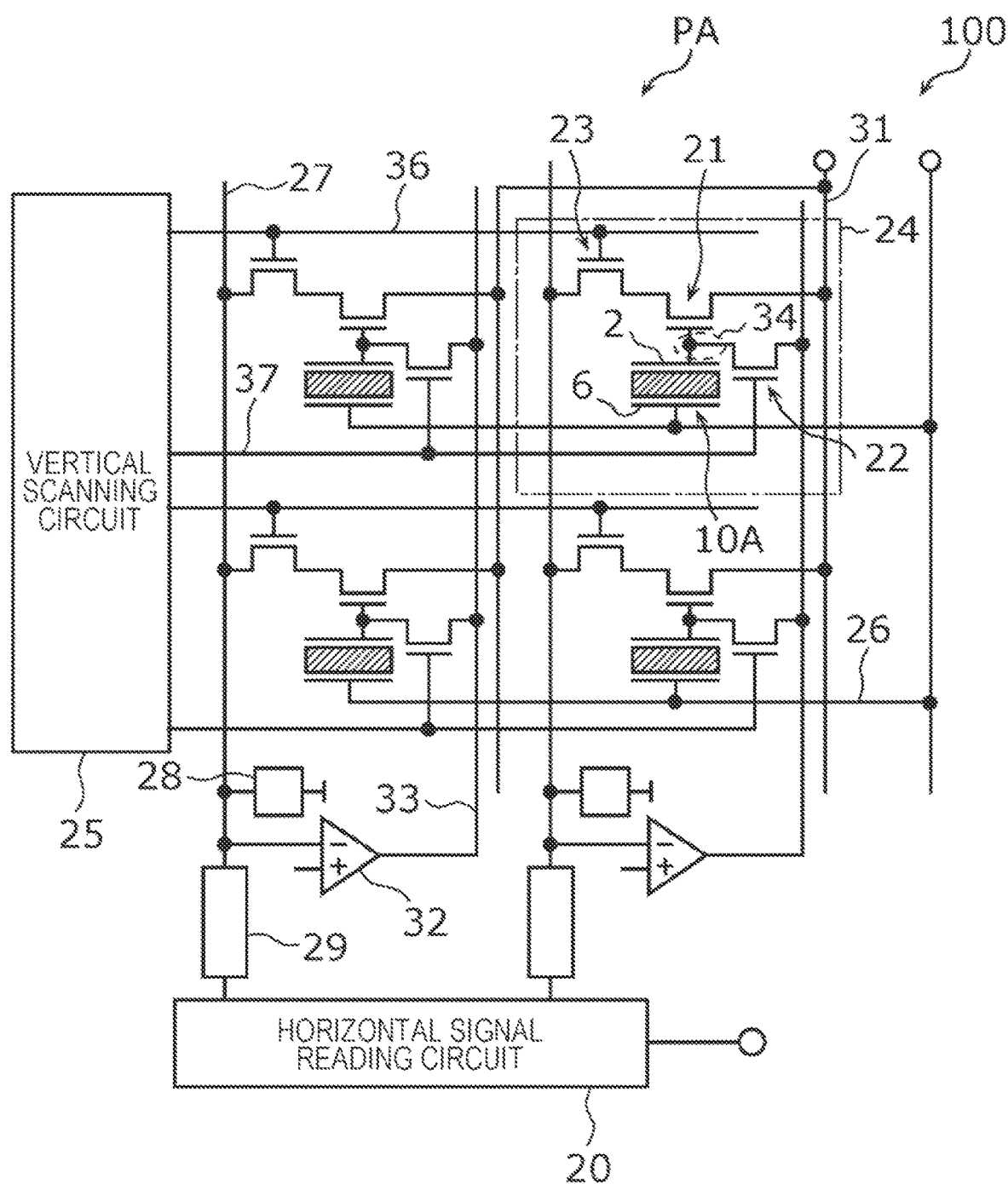
FIG. 3 is a diagram illustrating an example of a circuit configuration of an imaging apparatus according to an embodiment.
Figure 4:
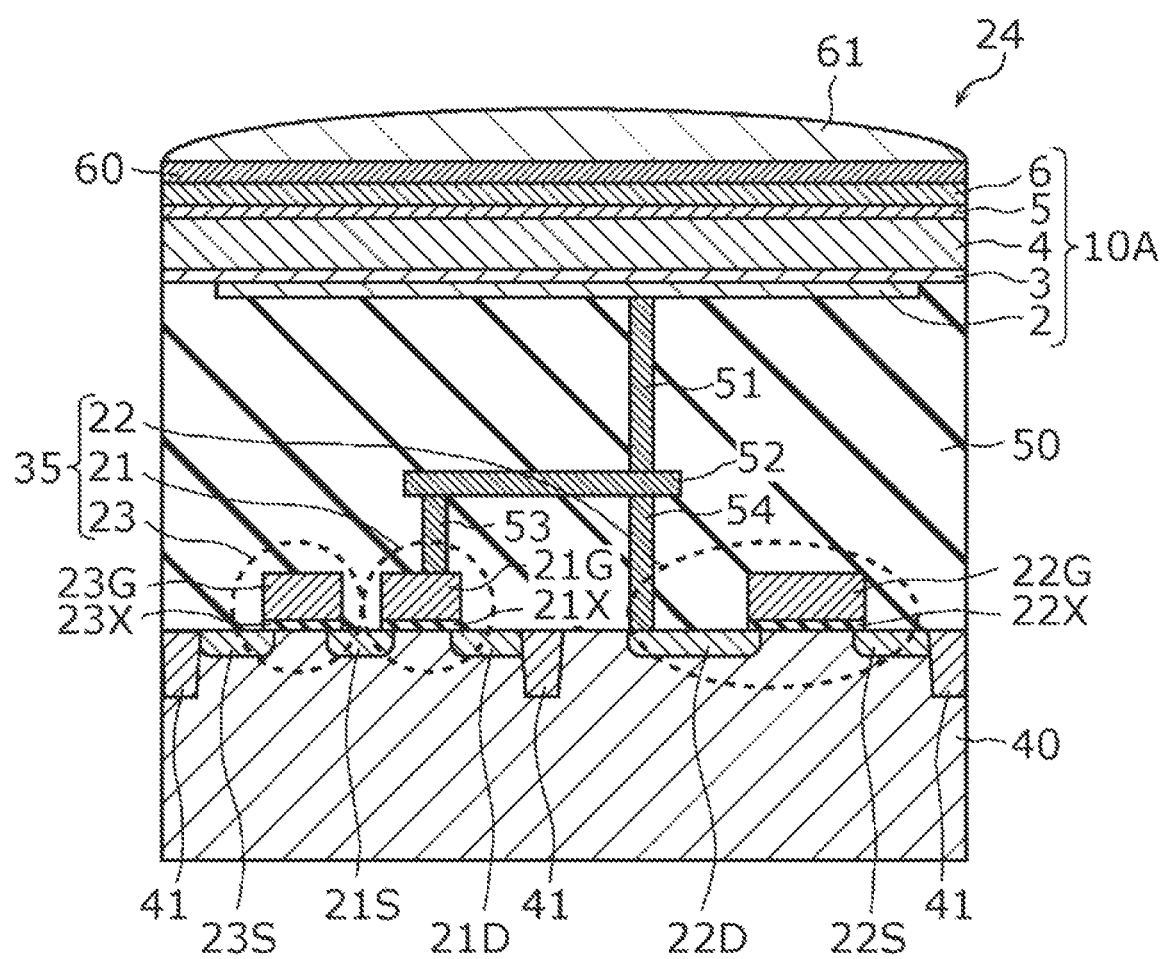
FIG. 4 is a schematic sectional view illustrating an example of a device structure of a pixel in an imaging apparatus according to an embodiment.

The imaging apparatus according to the present embodiment will be described below with reference to FIG. 3 and FIG. 4. FIG. 3 is a diagram illustrating an example of a circuit configuration of the imaging apparatus 100 equipped with a photoelectric conversion portion 10A including the photoelectric conversion element 10 illustrated in FIG. 2. FIG. 4 is a schematic sectional view illustrating an example of a device structure of a pixel 24 in the imaging apparatus 100 according to the present embodiment.

As illustrated in FIG. 3 and FIG. 4, the imaging apparatus 100 according to the present embodiment includes a semiconductor substrate 40, a charge detection circuit 35 disposed on the semiconductor substrate 40, the photoelectric conversion portion 10A disposed above the semiconductor substrate 40, and the pixel 24 including the charge-storage node 34 electrically connected to the charge detection circuit 35 and the photoelectric conversion portion 10A. The photoelectric conversion portion 10A of the pixel 24 includes the photoelectric conversion element 10. The charge-storage node 34 stores the electric charge obtained in the photoelectric conversion portion 10A, and the charge detection circuit 35 detects the electric charge stored in the charge detection circuit 35. In this regard, the charge detection circuit 35 disposed on the semiconductor substrate 40 may be disposed above the semiconductor substrate 40 or disposed directly in the semiconductor substrate 40.

As illustrated in FIG. 3, the imaging apparatus 100 includes a plurality of pixels 24 and peripheral circuits. The imaging apparatus 100 is an organic image sensor realized by the integrated circuit of a chip and has a pixel array PA including a plurality of pixels 24 that are two-dimensionally arranged.

The plurality of pixels 24 are arranged above the semiconductor substrate 40 two-dimensionally, that is, in the row direction and the column direction, and form a photosensitive region which is a pixel region. FIG. 3 illustrates an example in which the pixels 24 are arranged in a matrix of 2 rows and 2 columns. In FIG. 3, for the sake of facilitating illustration, a circuit for individually setting the sensitivity of the pixels 24 (for example, a pixel electrode control circuit) is omitted from the drawing. The imaging apparatus 100 may be a line sensor. In this case, the plurality of pixels 24 may be one-dimensionally arranged. In the present specification, the row direction and the column direction denote the extension directions of the row and the column, respectively. That is, in FIG. 3, the longitudinal direction of the drawing is the column direction, and the lateral direction is the row direction.

As illustrated in FIG. 3 and FIG. 4, each pixel 24 includes the charge-storage node 34 electrically connected to the photoelectric conversion portion 10A and the charge detection circuit 35. The charge detection circuit 35 includes an amplifying transistor 21, a reset transistor 22, and an address transistor 23.

The photoelectric conversion portion 10A includes the first electrode 2 disposed as a pixel electrode and the second electrode 6 disposed as a counter electrode. The photoelectric conversion portion 10A includes the above-described photoelectric conversion element 10. A predetermined bias voltage is applied to the second electrode 6 through a counter electrode signal line 26.

The first electrode 2 is connected to a gate electrode 21G of the amplifying transistor 21, and the signal charge collected by the first electrode 2 is stored in the charge-storage node 34 located between the first electrode 2 and the gate electrode 21G of the amplifying transistor 21. In the present embodiment, the signal charge is a hole.

The signal charge stored in the charge-storage node 34 is applied to the gate electrode 21G of the amplifying transistor 21 as a voltage in accordance with the amount of the signal charge. This voltage is amplified by the amplifying transistor 21 and is selectively read by the address transistor 23 as the signal voltage. The reset transistor 22 has a source/drain electrode connected to the first electrode 2 and resets the signal charge stored in the charge-storage node 34. In other words, the reset transistor 22 resets the potentials of the gate electrode 21G of the amplifying transistor 21 and the potential of the first electrode 2.

To selectively perform the above-described actions of the plurality of pixels 24, the imaging apparatus 100 includes power supply wiring lines 31, vertical signal lines 27, address signal lines 36, and rest signal lines 37, and lines from each of these are connected to each pixel 24. Specifically, the power supply wiring line 31 is connected to the source/drain electrode of the amplifying transistor 21, and the vertical signal line 27 is connected to the source/drain electrode of the address transistor 23. The address signal line 36 is connected to the gate electrode 23G of the address transistor 23. The rest signal line 37 is connected to the gate electrode 22G of the reset transistor 22.

The peripheral circuit includes a vertical scanning circuit 25, a horizontal signal reading circuit 20, a plurality of column signal processing circuits 29, a plurality of load circuits 28, and a plurality of differential amplifiers 32.

The vertical scanning circuit 25 is connected to the address signal lines 36 and the rest signal lines 37, selects, on a row-by-row basis, a plurality of pixels 24 arranged in each row, and reads the signal voltage and resets the potential of the first electrode 2. The power supply wiring line 31 that is a source follower power supply supplies a predetermined power supply voltage to each pixel 24. The horizontal signal reading circuit 20 is electrically connected to the plurality of column signal processing circuits 29. The column signal processing circuits 29 are electrically connected to the pixels 24 arranged in the respective rows through the vertical signal lines 27 for each of the respective rows. The load circuits 28 are electrically connected to the respective vertical signal lines 27. The load circuit 28 and the amplifying transistor 21 form a source follower circuit.

The plurality of differential amplifiers 32 are disposed for the respective columns. The negative-side input terminal of the differential amplifier 32 is connected to the corresponding vertical signal line 27. The output terminal of the differential amplifier 32 is connected to the pixels 24 through a feedback line 33 corresponding to each row.

The vertical scanning circuit 25 applies a row selection signal for controlling on and off of the address transistor 23 to the gate electrode 23G of the address transistor 23 through the address signal line 36. Consequently, a reading target row is scanned and selected. The signal voltage is read from the pixels in the selected row and sent to the vertical signal line 27. In addition, the vertical scanning circuit 25 applies a reset signal for controlling on and off of the reset transistor 22 to the gate electrode 22G of the reset transistor 22 through the reset signal line 37. Consequently, the row of the pixel 24 that is the target of the reset action is selected. The vertical signal line 27 transmits the signal voltage read from the pixel 24 selected by the vertical scanning circuit 25 to the column signal processing circuit 29.

The column signal processing circuit 29 performs noise-suppressing signal processing represented by correlated double sampling, analog-digital conversion (AD conversion), and the like.

The horizontal signal reading circuit 20 successively reads signals from the plurality of column signal processing circuits 29 to a horizontal common signal line (not illustrated in the drawing).

The differential amplifier 32 is connected to the drain electrode of the reset transistor 22 through the feedback line 33. Therefore, the negative terminal of the differential amplifier 32 receives the output value of the address transistor 23. The differential amplifier 32 performs a feedback action so that the gate potential of the amplifying transistor 21 becomes a predetermined feedback voltage. At this time, the output voltage value of the differential amplifier 32 is 0 V or a positive voltage in the vicinity of 0 V. Here, "feedback voltage" denotes the output voltage of the differential amplifier 32.

As illustrated in FIG. 4, the pixel 24 includes the semiconductor substrate 40, the charge detection circuit 35, the photoelectric conversion portion 10A, and the charge-storage node 34 (refer to FIG. 3).

The semiconductor substrate 40 may be an insulating substrate and the like in which a semiconductor layer is disposed on the surface to be provided with a photosensitive region and may be, for example, a P-type silicon substrate. The semiconductor substrate 40 has impurity regions 21D, 21S, 22D, 22S, and 23S and element isolation regions 41 for electrically isolating the pixels 24 from each other. The impurity regions 21D, 21S, 22D, 22S, and 23S are, for example, N-type regions. Herein, the element isolation region 41 is disposed between the impurity region 21D and the impurity region 22D. Consequently, leakage of the signal charge stored in the charge-storage node 34 is suppressed. The element isolation region 41 is formed by, for example, subjecting an acceptor to ion implantation under a predetermined implantation condition.

The impurity regions 21D, 21S, 22D, 22S, and 23S are, for example, diffusion regions formed in the semiconductor substrate 40. As illustrated in FIG. 4, the amplifying transistor 21 has the impurity region 21S, the impurity region 21D, and the gate electrode 21G. The impurity region 21S and the impurity region 21D function as, for example, a source region and a drain region, respectively, of the amplifying transistor 21. A channel region of the amplifying transistor 21 is formed between the impurity region 21S and the impurity region 21D.

Likewise, the address transistor 23 has the impurity region 23S, the impurity region 21S, and the gate electrode 23G connected to the address signal line 36. In this example, the amplifying transistor 21 and the address transistor 23 are electrically connected to each other by sharing the impurity region 21S. The impurity region 23S functions as, for example, a source region of the address transistor 23. The impurity region 23S has a connection to the vertical signal line 27 illustrated in FIG. 3.

The reset transistor 22 has the impurity regions 22D and 22S and the gate electrode 22G connected to the reset signal line 37. The impurity region 22S functions as, for example, a source region of the reset transistor 22. The impurity region 22S has a connection to the reset signal line 37 illustrated in FIG. 3.

An interlayer insulating layer 50 is stacked on the semiconductor substrate 40 so as to cover the amplifying transistor 21, the address transistor 23, and the reset transistor 22.

In the interlayer insulating layer 50, a wiring layer (not illustrated in the drawing) may be arranged. The wiring layer is formed of, for example, a metal such as copper and may include, for example, wiring lines of the above-described vertical signal line 27 and the like as part thereof. The number of insulating layers in the interlayer insulating layer 50 and the number of layers included in the wiring layer arranged in the interlayer insulating layer 50 can be optionally set.

In the interlayer insulating layer 50, a contact plug 53 connected to the gate electrode 21G of the amplifying transistor 21, a contact plug 54 connected to the impurity region 22D of the reset transistor 22, a contact plug 51 connected to the first electrode 2, and a wiring line 52 connecting the contact plug 51, the contact plug 54, and the contact plug 53 to each other are arranged. Consequently, the impurity region 22D of the reset transistor 22 is electrically connected to the gate electrode 21G of the amplifying transistor 21. In the configuration illustrated in FIG. 4, the contact plugs 51, 53, and 54, the wiring line 52, the gate electrode 21G of the amplifying transistor 21, and the impurity region 22D of the reset transistor 22 constitute at least part of the charge-storage node 34.

The charge detection circuit 35 detects a signal charge captured by the first electrode 2 and outputs a signal voltage. The charge detection circuit 35 includes the amplifying transistor 21, the reset transistor 22, and the address transistor 23 and is formed on the semiconductor substrate 40.

The amplifying transistor 21 includes the impurity region 21D and the impurity region 21S that are formed in the semiconductor substrate 40 and that function as the drain electrode and the source electrode, respectively, a gate insulating layer 21X formed on the semiconductor substrate 40, and the gate electrode 21G formed on the gate insulating layer 21X.

The reset transistor 22 includes the impurity region 22D and the impurity region 22S that are formed in the semiconductor substrate 40 and that function as the drain electrode and the source electrode, respectively, a gate insulating layer 22X formed on the semiconductor substrate 40, and the gate electrode 22G formed on the gate insulating layer 22X.

The address transistor 23 includes the impurity region 21S and the impurity region 23S that are formed in the semiconductor substrate 40 and that function as the drain electrode and the source electrode, respectively, a gate insulating layer 23X formed on the semiconductor substrate 40, and the gate electrode 23G formed on the gate insulating layer 23X. The amplifying transistor 21 is connected to the address transistor 23 in series through the impurity region 21S.

The above-described photoelectric conversion portion 10A is arranged on the interlayer insulating layer 50. In other words, in the present embodiment, a plurality of pixels 24 constituting the pixel array PA are formed on the semiconductor substrate 40. The plurality of pixels 24 two-dimensionally arranged on the semiconductor substrate 40 form a photosensitive region. The distance between two pixels 24 connected to each other (that is, pixel pitch) may be, for example, about 2 μm.

The photoelectric conversion portion 10A includes the structure of the above-described photoelectric conversion element 10.

A color filter 60 is formed above the photoelectric conversion portion 10A, and a microlens 61 is formed above the color filter 60. The color filter 60 is formed as, for example, an on-chip color filter by patterning, and a photosensitive resin or the like in which a dye or pigment is dispersed is used. The microlens is formed as, for example, an on-chip microlens, and an ultraviolet-sensitive material or the like is used.

Regarding the imaging apparatus 100, a common semiconductor production process can be used. In particular, in the case in which a silicon substrate is used as the semiconductor substrate 40, production can be performed by using various silicon semiconductor processes.

A system having a configuration in which a hole blocking layer that is an example of the electric charge blocking layer is disposed between the first electrode 2 and the photoelectric conversion layer 4, an electron blocking layer or the visible light absorbing layer 5 is disposed between the second electrode 6 and the photoelectric conversion layer 4, and the first electrode 2 is electrically connected to the charge-storage node 34 so as to store electrons in the charge-storage node 34 and perform reading may be adopted.

Figure 5:
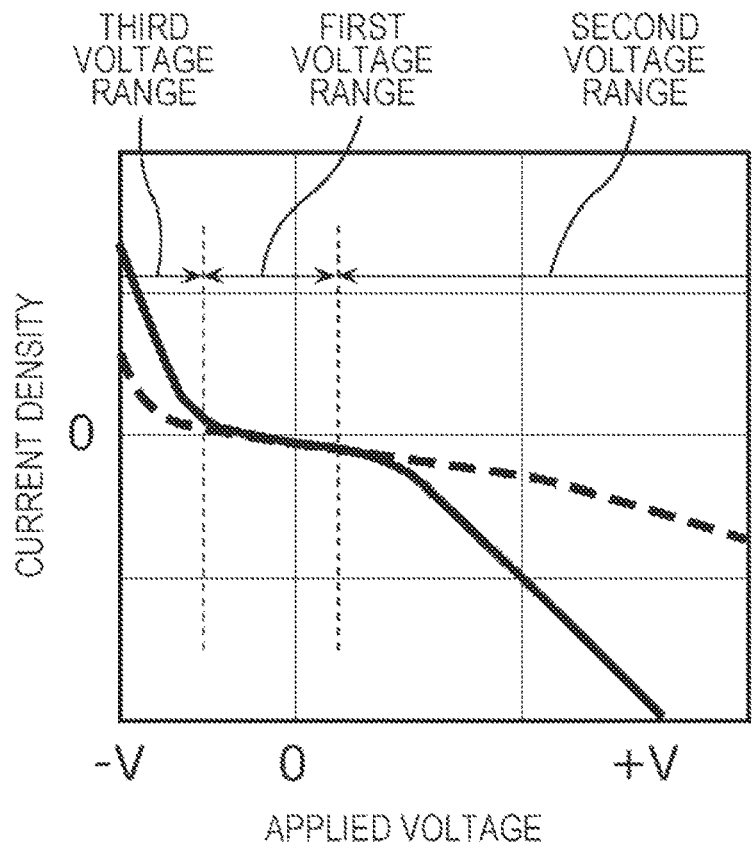
FIG. 5 is a schematic diagram illustrating an example of current-voltage characteristics of a photoelectric conversion layer according to an embodiment.

FIG. 5 is a schematic diagram illustrating an example of current-voltage (I-V) characteristics of the photoelectric conversion layer 4. In FIG. 5, a thick solid line graph illustrates exemplary I-V characteristics of the photoelectric conversion layer 4 when a voltage is applied between the first electrode 2 and the second electrode 6 while the light is applied. In addition, in FIG. 5, a thick broken line illustrates an example of I-V characteristics of the photoelectric conversion layer 4 when a voltage is applied between the first electrode 2 and the second electrode 6 while the light is not applied. Hereafter, in the description of the present specification, the voltage in the case in which a positive voltage is applied to the second electrode 6 is assumed to be a reverse-direction bias voltage, and the voltage in the case in which a negative voltage is applied is assumed to be the forward-direction bias voltage.

As illustrated in FIG. 5, the photocurrent characteristics of the photoelectric conversion layer 4 according to the present embodiment are roughly characterized by a first voltage range, a second voltage range, and a third voltage range. In the first voltage range, the dependence of a current change of the photoelectric conversion layer 4 on the voltage applied between the first electrode 2 and the second electrode 6 and the amount of the light incident on the photoelectric conversion layer 4 is small. That is, in the first voltage range, it is assumed that the difference between the value of the current that flows in the case in which the light is incident on the photoelectric conversion layer 4 and the value of the current that flows in the case in which the light is not incident is small. In the first voltage range, even if an electron-hole pair is generated by the light incident on the photoelectric conversion layer 4, since the absolute value of the voltage applied between the first electrode 2 and the second electrode 6 is not so large, recombination of the electron and the hole occurs before being separated. Meanwhile, even if the electron and the hole are separated, recombination occurs via the trap level and the like during transportation in the photoelectric conversion layer 4. Consequently, it is expected that the number of holes and electrons that flow into the electrode will be reduced even though complete elimination may be difficult.

The second voltage range in FIG. 5 is a voltage range of a reverse-direction bias and is a range in which the absolute value of the output current density increases in accordance with an increase in the reverse-direction bias voltage. That is, the second voltage range is a range in which the current value increases in accordance with an increase in the amount of the light incident on the photoelectric conversion layer 4 and an increase in the bias voltage applied between the first electrode 2 and the second electrode 6.

The third voltage range is a voltage range of a forward-direction bias and is a range in which the output current density increases in accordance with an increase in the forward-direction bias voltage. That is, the third voltage range is a range in which the current increases in accordance with an increase in the bias voltage applied between the first electrode 2 and the second electrode 6 even if the light is not incident on the photoelectric conversion layer 4.

The photoelectric conversion portion 10A of the imaging apparatus 100 according to the present embodiment including the photoelectric conversion layer 4 having the first voltage range in which difference between the value of the current that flows in the case in which the light is incident on the photoelectric conversion layer 4 and the value of the current that flows in the case in which the light is not incident is small enables the imaging apparatus 100 to realize a global shutter function while reducing parasitic sensitivity.

Action of Imaging Apparatus

Next, the action of the imaging apparatus 100 will be described with reference to FIG. 6 and FIG. 7. Herein, the case in which a hole is used as a signal charge is described.

Figure 6:
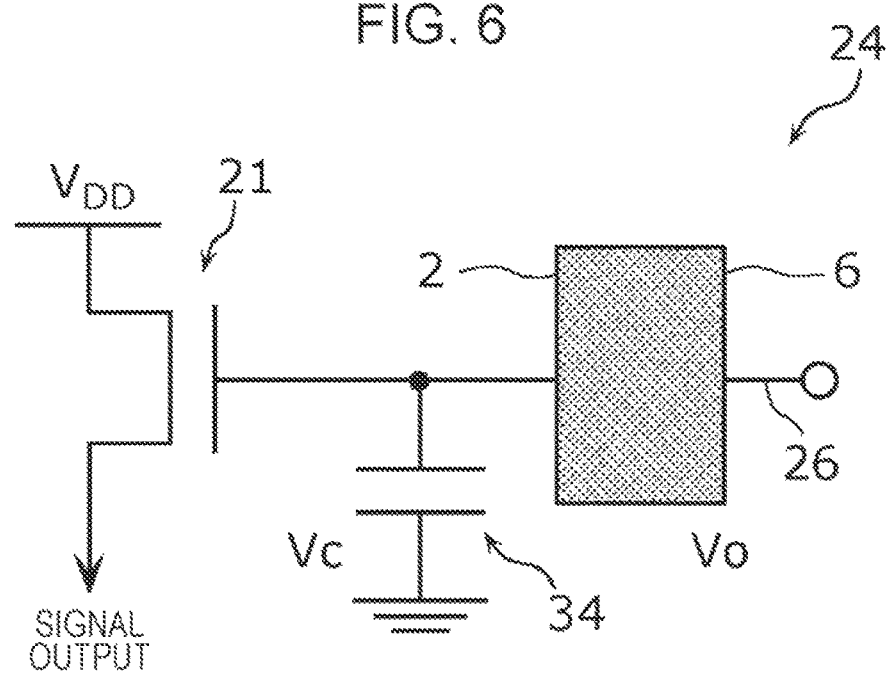
FIG. 6 is a schematic diagram illustrating part of the circuit configuration of a pixel according to an embodiment.

FIG. 6 is a schematic diagram illustrating part of the circuit configuration of the pixel 24. Herein, for the sake of simplifying illustration, a case in which one end of the charge-storage node 34 is grounded and the potential is zero is illustrated. This state corresponds to the case in which the feedback line 33 illustrated in FIG. 3 is set at zero. In this state, Vc is zero when the voltage of the charge-storage node 34 is denoted as Vc.

A voltage supply circuit (not illustrated in the drawing) supplies a voltage to the second electrode 6 through a counter electrode signal line 26 such that the voltage during an exposure time and the voltage during a non-exposure time differ from each other. In the present specification, "exposure time" denotes a time for storing, as the signal charge, one of the electron or the hole generated by photoelectric conversion into the charge-storage node 34. That is, "exposure time" may be referred to as "charge-storing time". In the present specification, a time other than the exposure time during the action of the imaging apparatus is denoted as "non-exposure time". "Non-exposure time" may be a time in which the light incident on the photoelectric conversion portion 10A is blocked or may be a time in which the light is applied to the photoelectric conversion portion 10A but the electric charge is substantially not stored in the charge-storage node 34.

In the initial state, the potential difference between the first electrode 2 and the second electrode 6 of the photoelectric conversion portion 10A, that is, the bias voltage applied to the photoelectric conversion layer 4, the electron blocking layer 3, and the visible light absorbing layer 5, is set to be a value within the first voltage range. For example, the voltage supply circuit applies a voltage equal to the voltage of the first electrode 2 to the second electrode 6 by using the counter electrode signal line 26. Herein, when the voltage applied to the second electrode 6 is denoted as V2, and V2 is assumed to be a reference voltage Vref. In this case, when the bias voltage applied to the photoelectric conversion portion 10A is denoted as Vo, since Vo=V2−Vc applies, Vo=0 is derived.

Next, the action during the exposure time will be described. At the start of the exposure time, the voltage supply circuit applies the voltage V2 to the second electrode 6 by using the counter electrode signal line 26 so as to apply a voltage, that is, a reverse-direction bias voltage, within the second voltage range to the photoelectric conversion portion 10A. For example, in the case in which the photoelectric conversion layer 4 is composed of an organic semiconductor material, V2 is a voltage of several V to about 10 V at the maximum. As a result, holes in an amount in accordance with the amount of the light incident on the photoelectric conversion layer 4 are stored, as the signal charge, in the charge-storage node 34 of each pixel 24.

Next, the action during the non-exposure time will be described. After the exposure time is completed, the voltage supply circuit applies the voltage V2 to the second electrode 6 by using the counter electrode signal line 26 so as to supply a voltage within the first voltage range to the photoelectric conversion portion 10A. For example, the voltage V2 applied to the second electrode 6 is set to be the reference voltage Vref. The charge-storage node 34 of each pixel 24 stores holes in an amount in accordance with the amount of the light incident on the photoelectric conversion layer 4 during the exposure time, and the value of Vc differs in accordance with the pixel 24. Since Vo=V2−Vc applies, regarding the pixel 24 not subjected to exposure, Vc is not changed and Vo is zero. However, regarding the pixel 24 with Vc that is changed, Vo is not zero. In the case in which a sufficiently large width of the first voltage range is ensured, even if the value of Vc differs in accordance with the pixel 24, the voltage V2 of the pixel 24 can be set so that the voltage Vo applied to the photoelectric conversion portion 10A falls within the first voltage range. Variations in the value of the voltage Vc that falls within the first voltage range correspond to the width of the dynamic range. For example, when the width of the first voltage range is greater than or equal to 0.5 V, in an imaging apparatus with a conversion gain of 50 μV/e⁻, a dynamic range of greater than or equal to 80 dB corresponding to a human eye can be ensured.

In the state in which a voltage V2 is applied to the second electrode 6 so that the voltage Vo falls within the first voltage range, a hole does not readily move to the charge-storage node 34 even if the light is incident on the pixel 24. In addition, holes stored in the charge-storage node 34 are not readily discharged to the first electrode 2, and the electric charge supplied from the voltage supply circuit through the second electrode 6 does not readily flow into the charge-storage node 34.

Therefore, holes stored in the charge-storage node 34 of each pixel 24 are held while the amount in accordance with the amount of the light incident on the photoelectric conversion layer 4 is maintained. That is, holes stored in the charge-storage node 34 of each pixel 24 can be held even if the light is incident on the photoelectric conversion layer 4 again unless the holes in the charge-storage node 34 are reset. Consequently, during the non-exposure time, even in the case in which reading actions are successively performed on a row-by-row basis, a new hole is not readily stored during the reading action. As a result, for example, rolling distortion does not occur in contrast to the rolling shutter. Therefore, for example, a global shutter function can be realized by a simple pixel circuit such as the pixel 24 without being provided with a transfer transistor and an additive storage capacity. Since the pixel circuit is simple, there are advantages in size reduction of the pixel 24 in the imaging apparatus 100.

Figure 7:
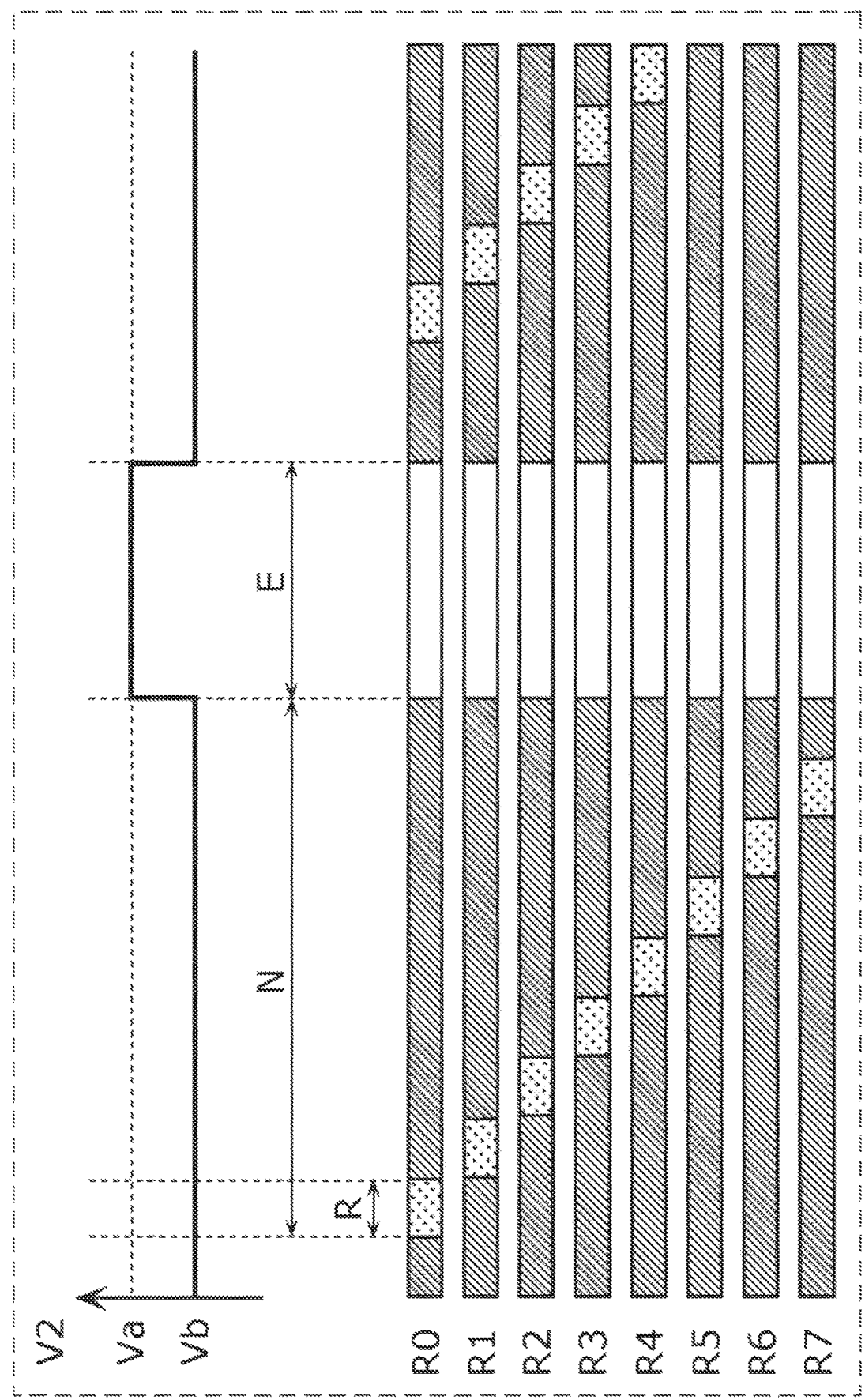
FIG. 7 is a timing chart illustrating an example of the timing of a voltage applied to a second electrode of a photoelectric conversion portion according to an embodiment and an action in each row of a pixel array of an imaging apparatus.

FIG. 7 is a timing chart illustrating an example of the timing of the voltage V2 applied to the second electrode 6 of the photoelectric conversion portion 10A and an action in each row of the pixel array PA of the imaging apparatus 100. For the sake of facilitating understanding, FIG. 7 illustrates just the change in the voltage V2 and the timing of the exposure and the signal reading in each of the rows denoted by R0 to R7 of the pixel array PA. As illustrated in FIG. 7, in the imaging apparatus 100, during the non-exposure time N, a voltage Vb is applied, as the voltage V2 for allowing the voltage Vo to fall within the first voltage range, to the second electrode 6, and during the exposure time E, a voltage Va for allowing the voltage Vo to fall within the second voltage range is applied to the second electrode 6. As illustrated in FIG. 7, during the non-exposure time N, signal reading R of each of the rows R0 to R7 is successively performed. Regarding all the rows R0 to R7, the timings of start of the exposure time E are the same and the timings of stop are the same. That is, the imaging apparatus 100 successively performs reading of the signals of the pixels 24 in each row while realizing the global shutter function in which all the rows of the pixel array PA are exposed in one operation.

As described above, the imaging apparatus 100 according to the present embodiment includes the photoelectric conversion element 10 that includes the first electrode 2, the second electrode 6, and the photoelectric conversion layer 4 located between the first electrode 2 and the second electrode 6. The photoelectric conversion layer 4 contains the first material, the second material, and the third material. The first material is a fullerene or a fullerene derivative. The second material is a donor-like organic semiconductor. The second material is a donor-like organic semiconductor material. The average absorption coefficient in the visible light wavelength range of the third material is less than the average absorption coefficient in the visible light wavelength range of the first material.

Consequently, polymerization of a fullerene or a fullerene derivative that is the first material is suppressed from occurring by the third material, a change in the characteristics of the photoelectric conversion element 10 is further suppressed, and, thereby the imaging apparatus 100 including the photoelectric conversion element 10 having improved reliability is realized.

Examples

The photoelectric conversion element included in the imaging apparatus according to the present disclosure will be specifically described below with reference to the examples. However, the present disclosure is not limited to just the following examples.

In particular, the photoelectric conversion element included in the imaging apparatus according to the embodiment of the present disclosure and a photoelectric conversion element for comparing the characteristics were produced, and a reliability test of the spectral sensitivity was performed.

Production of Photoelectric Conversion Element

Photoelectric conversion elements of examples and comparative examples were produced.

(1) Example 1 to Example 7

Regarding a support substrate, a substrate produced by forming TiN into a film was used. TiN having a work function of 4.7 eV was used as the first electrode 2. The electron blocking layer 3 was formed on the first electrode 2 by forming 9,9'-[1,1'-biphenyl]-4,4'-diylbis[3,6-bis(1,1-dimethyl ethyl)]-9H-carbazole serving as the material for forming the electron blocking layer 3 into a film by using a vacuum vapor deposition method.

The photoelectric conversion layer 4 was formed on the electron blocking layer 3 by co-vapor-depositing C60 fullerene serving as the first material 4A of the photoelectric conversion layer 4, subphthalocyanine serving as the second material 4B, and 9,9'-[1,1'-biphenyl]-4,4'-diylbis[3,6-bis(1,1-dimethyl ethyl)]-9H-carbazole, used in the electron blocking layer 3, serving as the third material 4C by using a vacuum vapor deposition method so that the contents thereof became as described in Table 2. The film thickness of the photoelectric conversion layer 4 obtained at this time was about 500 nm. Regarding subphthalocyanine, subphthalocyanine in which boron (B) was included as a center metal and a chloride ion serving as a ligand coordinated with B was used.

Figure 8A:
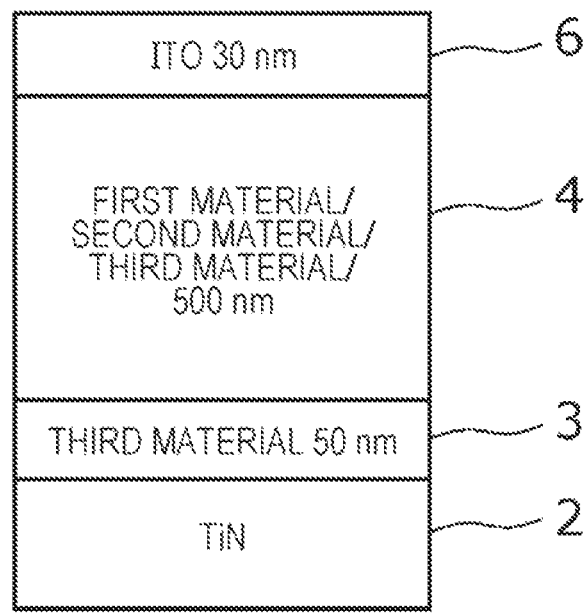
FIG. 8A is a schematic diagram illustrating the configuration of a photoelectric conversion element in Example 1 to Example 7.

An ITO film having a film thickness of 30 nm and serving as the second electrode 6 was formed on the photoelectric conversion layer 4 by using a sputtering method. Thereafter, an Al₂O₃ film serving as a sealing film was formed on the second electrode 6 by using an atomic layer deposition method so as to obtain a photoelectric conversion element. FIG. 8A illustrates the schematic configuration of the photoelectric conversion element in Example 1 to Example 7.

(2) Example 8

The same steps as in Example 1 to Example 7 were performed up to formation of the electron blocking layer 3 and the photoelectric conversion layer 4. Thereafter, the visible light absorbing layer 5 was formed on the photoelectric conversion layer 4 by vapor-depositing subphthalocyanine serving as the material for forming the visible light absorbing layer 5 through a metal shadow mask by using a vacuum vapor deposition method so as to have a film thickness of 10 nm.

Figure 8B:
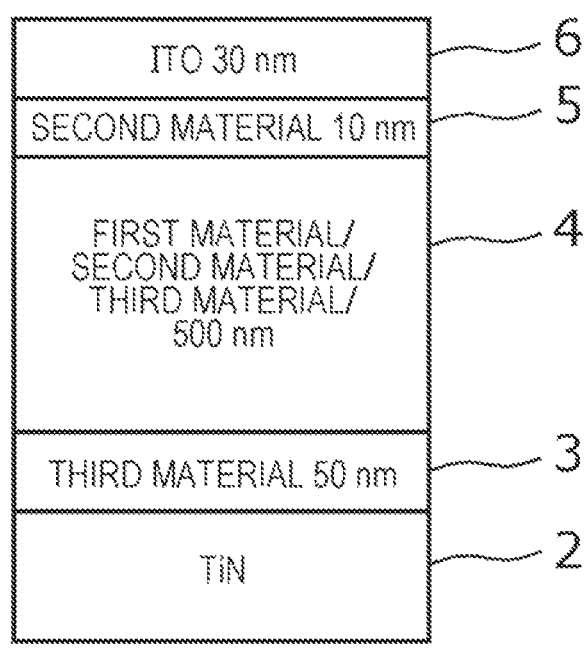
FIG. 8B is a schematic diagram illustrating the configuration of a photoelectric conversion element in Example 8.

An ITO film having a film thickness of 30 nm and serving as the second electrode 6 was formed on the visible light absorbing layer 5 by using a sputtering method. Thereafter, an $Al_2O_3$ film serving as a sealing film was formed on the second electrode 6 by using an atomic layer deposition method so as to obtain a photoelectric conversion element. FIG. 8B illustrates the schematic configuration of the photoelectric conversion element in Example 8.

(3) Comparative Example 1 to Comparative Example 3

Figure 8C:
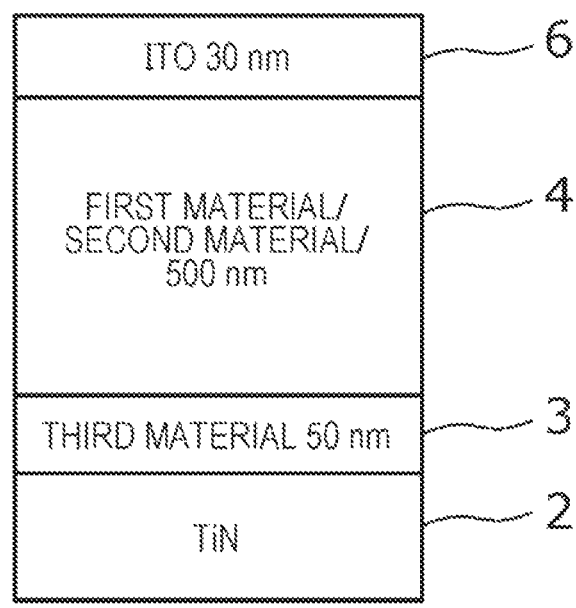
FIG. 8C is a schematic diagram illustrating the configuration of a photoelectric conversion element in Comparative example 1 to Comparative example 3.

A photoelectric conversion element was obtained by performing the same steps as in Example 1 to Example 7 except that the third material 4C was not used as the material for forming the photoelectric conversion layer 4 and the photoelectric conversion layer 4 was formed so as to have a first material 4A content and a second material 4B content described in Table 2. FIG. 8C illustrates the schematic configuration of the photoelectric conversion element in Comparative example 1 to Comparative example 3.

(4) Comparative Example 4

Figure 8D:
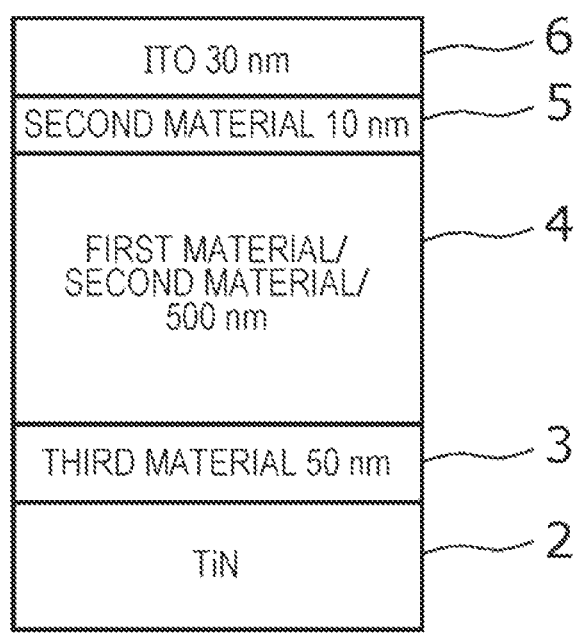
FIG. 8D is a schematic diagram illustrating the configuration of a photoelectric conversion element in Comparative example 4.

A photoelectric conversion element was obtained by performing the same steps as in Example 8 except that the third material 4C was not used as the material for forming the photoelectric conversion layer 4 and the photoelectric conversion layer 4 was formed so as to have a first material 4A content and a second material 4B content described in Table 2. FIG. 8D illustrates the schematic configuration of the photoelectric conversion element in Comparative example 4. Measurement of ionization potential, electron affinity, and average absorption coefficient in visible light wavelength range Regarding each of the materials used in the examples and the comparative examples, the ionization potential, the electron affinity, and the average absorption coefficient in the visible light wavelength range were measured.

Regarding the measurement of the ionization potential, initially, a sample in which a film of each of the materials used in the examples and comparative examples was made on a glass substrate provided with ITO formed into a film was prepared. Subsequently, regarding the prepared sample, the number of photoelectrons was measured by using a photoelectron spectroscope (AC-3 produced by RIKEN KEIKI Co., Ltd.) in air while the energy of ultraviolet irradiation was changed, and the energy position at which detection of a photoelectron was started was assumed to be an ionization potential.

Regarding the measurement of the average absorption coefficient in the visible light wavelength range, initially, a sample in which a film of each of the materials used in the examples and comparative examples was made on a quartz substrate was prepared. Subsequently, regarding the prepared sample, an absorption spectrum was measured by using a spectrophotometer (U4100 produced by Hitachi High-Technologies Corporation). An average absorption coefficient in the visible light wavelength range was calculated by dividing the average value of absorbance in the wavelength range of greater than or equal to 400 nm and less than or equal to 700 nm of the resulting absorption spectrum by the film thickness of the sample.

Regarding the measurement of the electron affinity, initially, the optical band gap was calculated from the result of the absorption edge of the absorption spectrum obtained by the above-described measurement of the average absorption coefficient in the visible light wavelength range. The electron affinity was estimated on the basis of subtraction of the calculated optical band gap from the ionization potential obtained by the above-described measurement of the ionization potential.

Figure 9A:
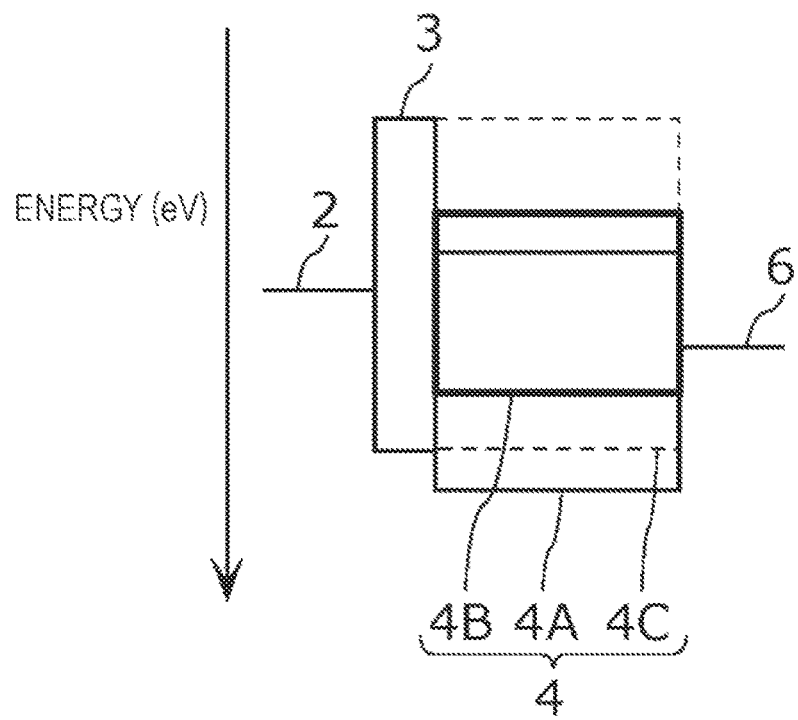
FIG. 9A is an energy band diagram of a photoelectric conversion element in Example 1 to Example 7.
Figure 9B:
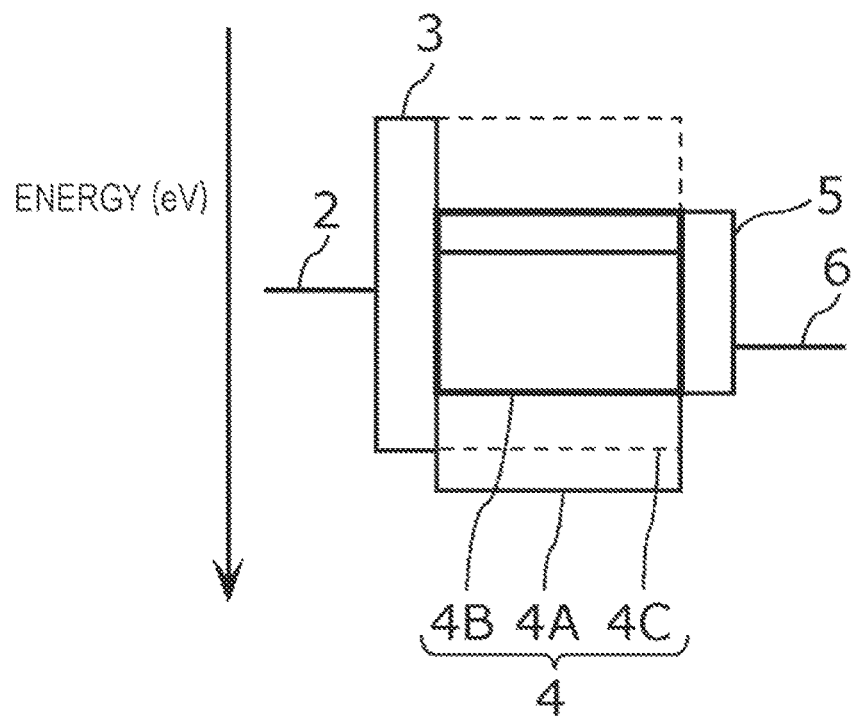
FIG. 9B is an energy band diagram of a photoelectric conversion element in Example 8.
Figure 9C:
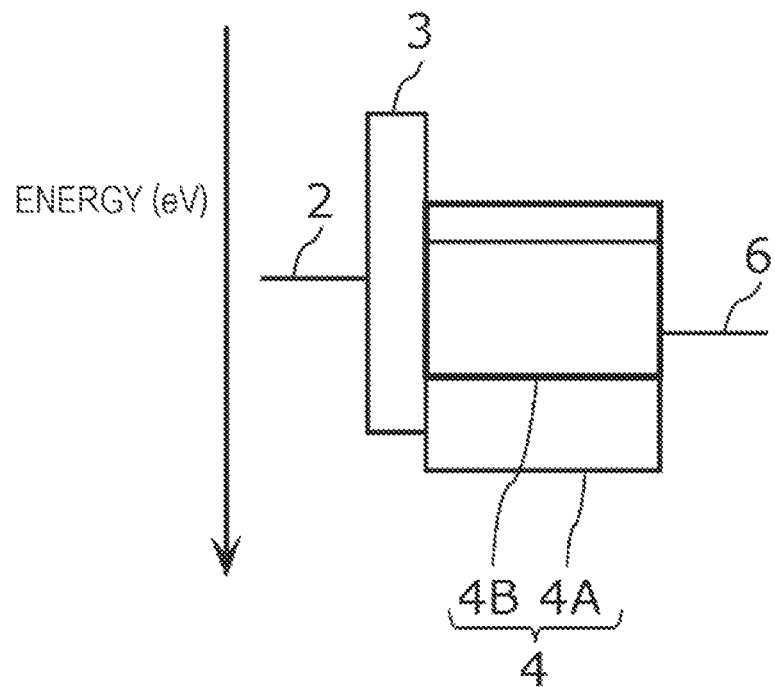
FIG. 9C is an energy band diagram of a photoelectric conversion element in Comparative example 1 to Comparative example 3.
Figure 9D:
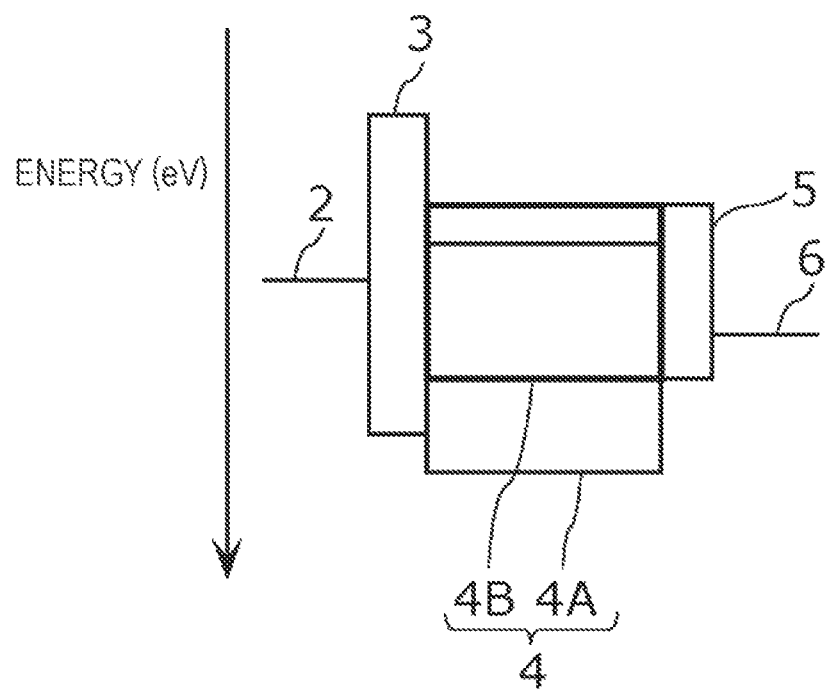
FIG. 9D is an energy band diagram of a photoelectric conversion element in Comparative example 4.

Table describes the ionization potential, the electron affinity, and the average absorption coefficient in the visible light wavelength range of each of the materials used in the examples and the comparative examples. FIG. 9A is an energy band diagram of the photoelectric conversion element in Example 1 to Example 7. FIG. 9B is an energy band diagram of the photoelectric conversion element in Example 8. FIG. 9C is an energy band diagram of the photoelectric conversion element in Comparative example 1 to Comparative example 3. FIG. 9D is an energy band diagram of the photoelectric conversion element in Comparative example 4.

TABLE 1

| Layer | Material | Ionization potential (eV) | Electron affinity (eV) | Average absorption coefficient ($\mu m^{-1}$) |
| --- | --- | --- | --- | --- |
| Electron blocking layer | 9.9'-[1,1'-Biphenyl]-4,4'-diylbis[3,6-bis(1,1-dimethylethyl)]-9H-carbazole (third material) | 5.8 | 2.7 | 2.1 |
| Photoelectric conversion layer | C60 fullerene (first material) | 6.2 | 4.2 | 4.2 |
| | subphthalocyanine (second material) | 5.5 | 3.4 | 5.4 |
| | 9.9'-[1,1'-Biphenyl]-4,4'-diylbis[3,6-bis(1,1-dimethylethyl)]-9H-carbazole (third material) | 5.8 | 2.7 | 2.1 |
| Visible light absorbing layer | subphthalocyanine (second material) | 5.5 | 3.4 | 5.4 |

In the present examples, the same material as the third material 4C of the photoelectric conversion layer 4 was used as the material for forming the electron blocking layer 3, and the same material as the second material 4B of the photoelectric conversion layer 4 was used as the material for forming the visible light absorbing layer 5. However, other materials having the respective predetermined characteristics may be used. Meanwhile, for example, a material having absorption characteristics with respect to near-infrared light being used as the second material 4B of the photoelectric conversion layer 4 enables the reliability of the photoelectric conversion element and the imaging apparatus having sensitivity to the near-infrared light to be improved.

Reliability Test of Spectral Sensitivity

The photoelectric conversion elements in the examples and the comparative examples were subjected to a reliability test of spectral sensitivity. Specifically, regarding the spectral sensitivity of the photoelectric conversion elements in the examples and the comparative examples, the external quantum efficiency under an application of the light having a wavelength of 450 nm was measured and a change in the external quantum efficiency was examined. A spectral response measurement system (CEP-2000 produced by Bunkoukeiki Co., Ltd.) was used for measuring the spectral sensitivity. Regarding the reliability test of the spectral sensitivity, a solar simulator (HAL-320 W produced by Asahi Spectra Co., Ltd.) was used, the light of 100,000 lx was applied for 150 hours, and a change in the external quantum efficiency from the start of light irradiation to 150 hours of light irradiation was measured.

Table 2 and FIG. 10 illustrate the results of the reliability test of spectral sensitivity of the photoelectric conversion element in the examples and the comparative examples. Table 2 describes the content of each material in the photoelectric conversion layer, the external quantum efficiency at start of light irradiation and after a lapse of 150 hours from the start of light irradiation, and the amount of change in the external quantum efficiency from the start of light irradiation to 150 hours after the start of light irradiation. FIG. 10 illustrates change over time of the external quantum efficiency of the photoelectric conversion element in Example 1, Example 2, and Comparative example 1.

As illustrated in FIG. 10, regarding the photoelectric conversion element in Example 1 and Example 2 in which the third material content was less than or equal to 3% by weight, even if the light irradiation time was increased, the external quantum efficiency was not readily reduced, and long-time reliability was particularly excellent.

When Example 2 is compared with Example 8, in which the contents of the material for forming the photoelectric conversion layer were the same and which differed from each other in whether the visible light absorbing layer was included, the external quantum efficiency of the photoelectric conversion element including the visible light absorbing layer in Example 8 was not readily reduced. Therefore, it was ascertained that the photoelectric conversion element including the visible light absorbing layer enables the reliability to be further improved.

The imaging apparatus according to the present disclosure has been described above with reference to the embodiment

TABLE 2

| | Content of each material in photoelectric conversion layer | | | Visible light absorbing layer | External quantum efficiency @450 nm | | |
|---|---|---|---|---|---|---|---|
| | first material | second material | third material | | At start | After 150 h | Amount of change |
| Example 1 | 82.8 wt % | 16.0 wt % | 1.2 wt % | none | 50% | 48% | −2% |
| Example 2 | 81.6 wt % | 16.0 wt % | 2.4 wt % | none | 50% | 47% | −3% |
| Example 3 | 80.5 wt % | 16.0 wt % | 3.5 wt % | none | 47% | 43% | −4% |
| Example 4 | 79.4 wt % | 16.0 wt % | 4.6 wt % | none | 45% | 41% | −5% |
| Example 5 | 78.3 wt % | 16.0 wt % | 5.7 wt % | none | 43% | 37% | −5% |
| Example 6 | 76.0 wt % | 21.0 wt % | 3.0 wt % | none | 51% | 47% | −4% |
| Example 7 | 83.7 wt % | 14.0 wt % | 2.3 wt % | none | 49% | 44% | −5% |
| Example 8 | 81.6 wt % | 16.0 wt % | 2.4 wt % | present | 49% | 48% | −1% |
| Comparative example 1 | 84.0 wt % | 16.0 wt % | 0 wt % | none | 51% | 43% | −8% |
| Comparative example 2 | 86.0 wt % | 14.0 wt % | 0 wt % | none | 50% | 40% | −10% |
| Comparative example 3 | 79.0 wt % | 21.0 wt % | 0 wt % | none | 52% | 42% | −10% |
| Comparative example 4 | 84.0 wt % | 16.0 wt % | 0 wt % | present | 50% | 43% | −7% |

As described in Table 2, when Examples 1 to 8 are compared with Comparative examples 1 to 4, a reduction in the external quantum efficiency due to light irradiation of the photoelectric conversion element in each of Examples 1 to 8 was small as compared with the photoelectric conversion element in each of Comparative examples 1 to 4. For example, the amount of change in the external quantum efficiency of the photoelectric conversion element in Comparative example 1 was −8% whereas the amount of change in the external quantum efficiency of the photoelectric conversion element in each of Example 1 to Example 5, which had the same second material content as the comparative example, was −2% to −5%. Consequently, it was ascertained that, regarding the photoelectric conversion element in the example, the external quantum efficiency was not readily reduced and the reliability was improved as compared with the photoelectric conversion element in the comparative example.

Regarding the photoelectric conversion element in Example 1 to Example 4, Example 6, and Example 7 in which the third material content was less than or equal to 5% by weight, the external quantum efficiency at start of light irradiation was greater than or equal to 45% by weight, the external quantum efficiency was not readily reduced, and, in addition, the external quantum efficiency of the photoelectric conversion element was particularly high.

and the examples. However the present disclosure is not limited to these embodiment and examples. The embodiment and the example including various modifications conceived by a person skilled in the art and other embodiments constructed by combining some constituent elements of the embodiment and the examples are included in the scope of the present disclosure without departing from the spirit of the present disclosure.

The imaging apparatus according to the present disclosure can be applied to various camera systems and sensor systems such as medical cameras, surveillance cameras, car-mounted cameras, range finder cameras, microcameras, drone cameras, and robot cameras.

What is claimed is:

1. An imaging apparatus comprising:
    a first electrode;
    a second electrode; and
    a photoelectric conversion layer located between the first electrode and the second electrode,
    wherein the photoelectric conversion layer contains a first material, a second material, and a third material,
    the first material is a fullerene or a fullerene derivative,
    the second material is a donor-like organic semiconductor material, and
    an average absorption coefficient in a visible light wavelength range of the third material is less than an average absorption coefficient in the visible light wavelength range of the first material.

2. The imaging apparatus according to claim 1,
wherein the average absorption coefficient in the visible light wavelength range of the third material is less than an average absorption coefficient in the visible light wavelength range of the second material.

3. The imaging apparatus according to claim 1,
wherein the average absorption coefficient in the visible light wavelength range of the third material is less than or equal to 4 $\mu m^{-1}$.

4. The imaging apparatus according to claim 1,
wherein an ionization potential of the third material is greater than an ionization potential of the second material.

5. The imaging apparatus according to claim 1,
wherein an electron affinity of the third material is less than an electron affinity of the first material.

6. The imaging apparatus according to claim 1,
wherein a content of the third material in the photoelectric conversion layer is greater than or equal to 0.1% by weight and less than or equal to 10% by weight.

7. The imaging apparatus according to claim 1,
wherein a band gap of the third material is greater than or equal to 3.0 eV.

8. The imaging apparatus according to claim 1,
wherein the third material is an organic semiconductor material.

9. The imaging apparatus according to claim 1, further comprising an electric charge blocking layer located between the first electrode and the photoelectric conversion layer.

10. The imaging apparatus according to claim 9,
wherein the electric charge blocking layer contains the third material.

11. The imaging apparatus according to claim 1,
wherein a content of the second material in the photoelectric conversion layer is greater than or equal to 10% by weight and less than or equal to 25% by weight.

12. The imaging apparatus according to claim 1, further comprising a visible light absorbing layer located between the photoelectric conversion layer and the second electrode.

13. The imaging apparatus according to claim 12,
wherein an average absorption coefficient in the visible light wavelength range of the visible light absorbing layer is greater than or equal to 2 $\mu m^{-1}$ and less than or equal to 16 $\mu m^{-1}$.

14. The imaging apparatus according to claim 12,
wherein the visible light absorbing layer contains the second material.

15. The imaging apparatus according to claim 12,
wherein the visible light absorbing layer contains the third material.

16. The imaging apparatus according to claim 1,
wherein the photoelectric conversion layer is a mixture film having a bulk heterostructure that contains the first material, the second material, and the third material.

* * * * *